(12) United States Patent
Choi

(10) Patent No.: US 11,316,119 B2
(45) Date of Patent: Apr. 26, 2022

(54) CURVED DISPLAY APPARATUS AND METHOD OF MANUFACTURING THE SAME

(71) Applicant: LG DISPLAY CO., LTD., Seoul (KR)

(72) Inventor: Hyuck Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 322 days.

(21) Appl. No.: 16/218,290

(22) Filed: Dec. 12, 2018

(65) Prior Publication Data

US 2019/0181365 A1 Jun. 13, 2019

(30) Foreign Application Priority Data

Dec. 13, 2017 (KR) .................. 10-2017-0170909

(51) Int. Cl.
*H01L 51/00* (2006.01)
*H01L 27/32* (2006.01)
(Continued)

(52) U.S. Cl.
CPC ........ *H01L 51/0097* (2013.01); *H01L 27/326* (2013.01); *H01L 27/3246* (2013.01);
(Continued)

(58) Field of Classification Search
CPC ............... H01L 27/326; H01L 51/5209; H01L 27/3246; H01L 51/5225; H01L 51/5253; H01L 27/3258; H01L 51/0097; H01L 27/3272; H01L 51/5281; H01L 51/529; H01L 51/56; H01L 27/1288; H01L 51/5218; H01L 51/5234; H01L 2227/323; H01L 2251/5338; H01L 27/3244;
(Continued)

(56) References Cited

U.S. PATENT DOCUMENTS 8,519,385 B2 8/2013 Lim et al.
10,454,051 B2 * 10/2019 Heo .................. H01L 51/5225
(Continued)

FOREIGN PATENT DOCUMENTS

KR 10-2013-0044672 A 5/2013
KR 20150003572 A 1/2015
KR 20160015815 A 2/2016

OTHER PUBLICATIONS

Notice of Allowance dated Jan. 22, 2020 issued in a corresponding Korean Patent Application No. 10-2017-0170909 (5 pages).

*Primary Examiner* — Shahed Ahmed
*Assistant Examiner* — Sun Mi Kim King
(74) *Attorney, Agent, or Firm* — Polsinelli PC

(57) ABSTRACT

Disclosed are a curved display apparatus and a method of manufacturing the same, which improve a luminance difference between a flat part and a curved part. The curved display apparatus having a flat part and a bending part extending from one side of the flat part, either of the flat part and the bending part defining a plurality of emission areas therein, wherein the curved display apparatus comprises: a light emitting device layer including a plurality of light emitting devices to form the emission areas, wherein a slope film is provided in the bending part such that an emission surface of the emission areas in the bending part is almost parallel to an emission surface of the emission areas in the flat part.

17 Claims, 18 Drawing Sheets

(51) Int. Cl.
　　　*H01L 51/52*　　　(2006.01)
　　　*H01L 51/56*　　　(2006.01)
　　　*H01L 27/12*　　　(2006.01)
(52) U.S. Cl.
　　　CPC ...... *H01L 27/3258* (2013.01); *H01L 27/3272* (2013.01); *H01L 51/529* (2013.01); *H01L 51/5209* (2013.01); *H01L 51/5253* (2013.01); *H01L 51/5281* (2013.01); *H01L 51/56* (2013.01); *H01L 27/1288* (2013.01); *H01L 51/5218* (2013.01); *H01L 51/5234* (2013.01); *H01L 2227/323* (2013.01); *H01L 2251/5338* (2013.01)
(58) Field of Classification Search
　　　CPC ............. H01L 51/5237; H01L 27/3262; H01L 51/5203; Y02E 10/549; Y02P 70/50
　　　See application file for complete search history.

(56) References Cited

U.S. PATENT DOCUMENTS

| | | | |
|---|---|---|---|
| 2014/0312319 | A1 | 10/2014 | Kim |
| 2015/0001477 | A1* | 1/2015 | Namkung ........... H01L 27/3258 257/40 |
| 2015/0137090 | A1* | 5/2015 | Lee ..................... H01L 27/3258 257/40 |
| 2016/0020430 | A1* | 1/2016 | Kim ................... H01L 51/5218 257/40 |
| 2016/0226013 | A1* | 8/2016 | Liu ..................... H01L 27/3218 |
| 2017/0287997 | A1 | 10/2017 | Park |
| 2019/0341430 | A1* | 11/2019 | Lee ...................... H01L 27/326 |

* cited by examiner

CURVED DISPLAY APPARATUS AND METHOD OF MANUFACTURING THE SAME

CROSS-REFERENCE TO RELATED APPLICATIONS

This application claims the benefit of the Korean Patent Application No. 10-2017-0170909 filed on Dec. 13, 2017, which is hereby incorporated by reference as if fully set forth herein.

BACKGROUND

Field of the Invention

The present disclosure relates to a curved display apparatus and a method of manufacturing the same.

Discussion of the Related Art

With the advancement of information-oriented society, various requirements for display devices for displaying an image are increasing. Various display devices such as liquid crystal display (LCD) devices and light emitting display apparatuses are being practically used. Light emitting display apparatuses may be categorized into organic light emitting display apparatuses, which use an organic light emitting layer as a light emitting element, and light emitting diode display devices which use a micro light emitting diode as a light emitting element. Light emitting display apparatuses are driven with a low voltage and have a thin thickness, an excellent viewing angle, and a fast response time.

Since light emitting display apparatuses do not need a backlight, researches for developing flexible display apparatuses having flexibility are being done recently. The flexible display apparatuses each include a pixel array layer which is provided on a flexible substrate having flexibility and include a plurality of thin film transistors (TFTs) and a plurality of lines, and since the flexible display apparatuses display an image even when being bent or folded, the flexible display apparatuses may be applied to various fields. The flexible display apparatuses may be categorized into curved display apparatuses, which are bent at a certain curvature, and foldable display apparatuses which are folded to an inner side or an outer side. The curved display apparatuses denote display apparatuses where a flexible display module having flexibility is attached on a curved cover substrate.

Curved display apparatuses may each include a flat part and a bending part. The bending part extends from the flat part and is bent at a certain curvature. Therefore, a display surface of the flat part is flat, and a display surface of the bending part is bent at a certain curvature. When an angle between the display surface of the flat part and the tangent plane at one point of the display surface of the bending part is defined as a bending angle "θ" at this point of the bending part, an emission direction of an image in the flat part and an emission direction of an image in the bending part may have an angle difference, which is substantially the same as the bending angle "θ", or an angle difference "θ'" which is almost similar to the bending angle "θ".

FIG. 1 is a graph showing a luminance variation with respect to a viewing angle, and FIG. 2 is a graph showing a color shift with respect to a viewing angle. In FIGS. 1 and 2, an angle when seen from the front of a curved display apparatus by a user, namely, an angle when seen at a position vertical to a display surface of the curved display apparatus, is defined as a viewing angle of zero degree. As in FIG. 1, as a viewing angle increases for each of red (R), green (G), blue (B), and white (W), the intensity is reduced. Also, as in FIG. 2, as the viewing angle increases, a color shift (or a color viewing angle difference) "Δu'v'" increases. When the color shift "Δu'v'" is 0.020 or more, the user may recognize that colors differ with respect to the viewing angle.

As described above, even when the flat part and the bending part emit lights having the same luminance, an emission direction in the flat part and an emission direction in the bending part have an angle difference "θ" or "θ'". For this reason, when the user watches an image displayed by the curved display apparatus at the front of the flat part, the user may recognize that a luminance of an image displayed by the bending part is lower than that of an image displayed by the flat part, and there is a color shift between the flat part and the bending part. Also, when the user watches the image displayed by the curved display apparatus at the front of the bending part, the user may recognize that the luminance of the image displayed by the flat part is lower than that of the image displayed by the bending part, and there is a color shift between the flat part and the bending part.

SUMMARY

Accordingly, the present disclosure is directed to provide a curved display apparatus and a method of manufacturing the same that substantially obviate one or more problems due to limitations and disadvantages of the related art.

An aspect of the present disclosure is directed to provide a curved display apparatus and a method of manufacturing the same, which improve a luminance difference between a flat part and a curved part.

In addition to the aforesaid objects of the present disclosure, other features and advantages of the present disclosure will be described below, but will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a curved display apparatus having a flat part and a bending part extending from one side of the flat part, either of the flat part and the bending part defining a plurality of emission areas therein, wherein the curved display apparatus comprises: a light emitting device layer including a plurality of light emitting devices to form the emission areas, wherein a slope film is provided in the bending part such that an emission surface of the emission areas in the bending part is almost parallel to an emission surface of the emission areas in the flat part.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
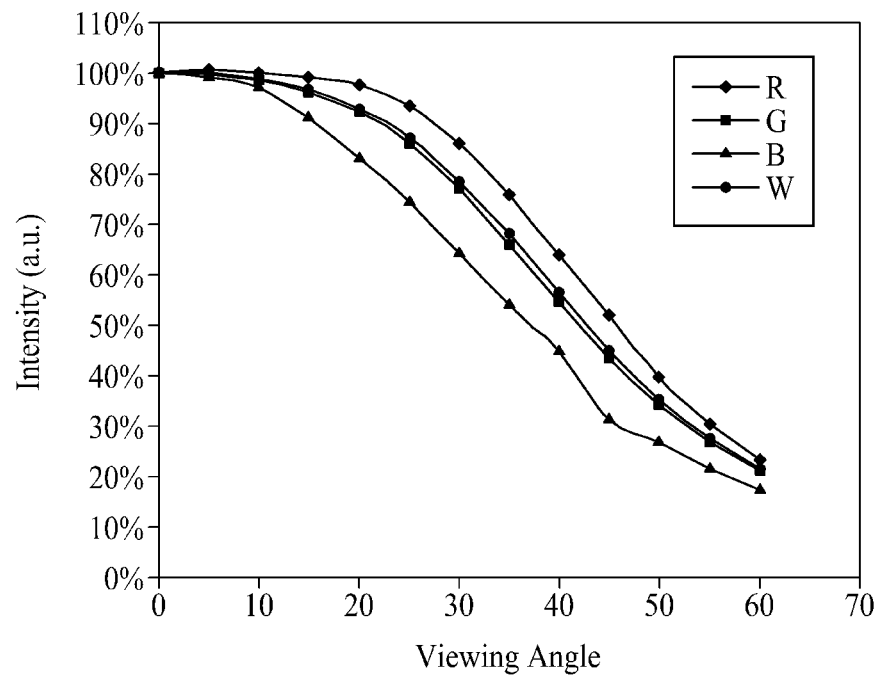
FIG. 1 is a graph showing an luminance variation with respect to a viewing angle.
Figure 2:
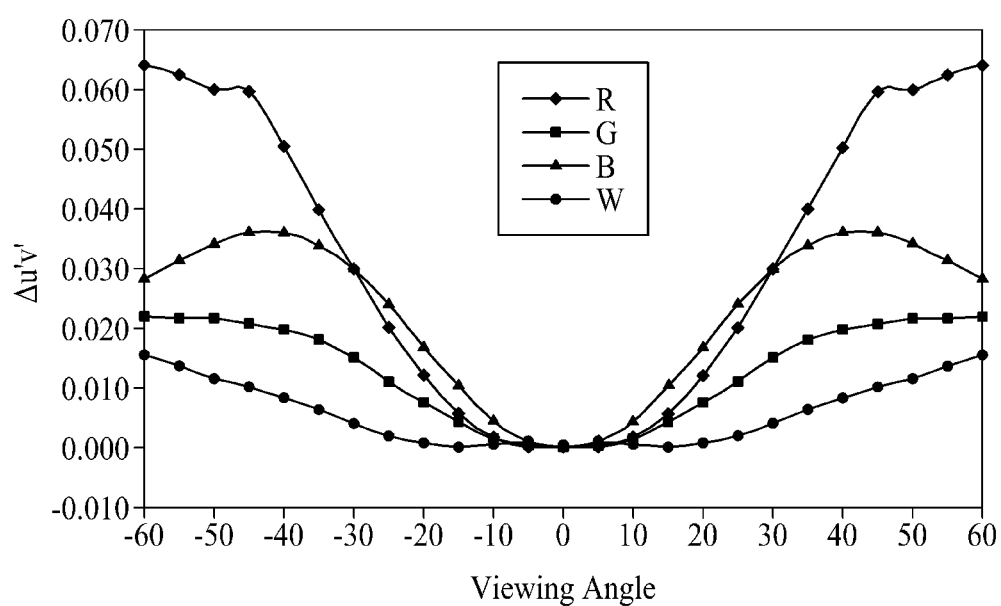
FIG. 2 is a graph showing a color shift with respect to a viewing angle.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 3:
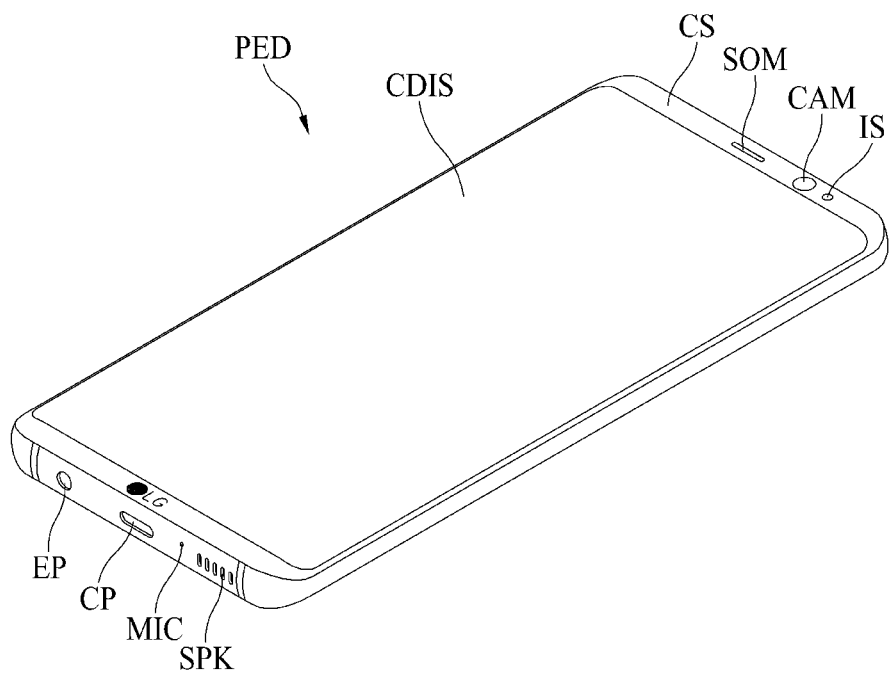
FIG. 3 is a perspective view illustrating a portable electronic device including a curved display apparatus according to an embodiment of the present disclosure.

FIG. 3 is a perspective view illustrating a portable electronic device PED including a curved display apparatus according to an embodiment of the present disclosure.

Referring to FIG. 3, the portable electronic device PED according to an embodiment of the present disclosure is illustrated as a smartphone, but is not limited thereto. That is, the portable electronic device PED according to an embodiment of the present disclosure may be a tablet PC, a notebook computer, or the like. Also, the curved display apparatus according to an embodiment of the present disclosure may be applied to various electronic devices such as monitors and televisions (TVs), in addition to the portable electronic device PED.

The portable electronic device PED may include a case CS forming an external appearance, a display apparatus CDIS, a sound output module SOM, an image sensor CAM, an illumination sensor IS, a speaker SPK, a microphone MIC, an earphone port EP, and a charging port CP.

The case CS may be provided to cover a front surface, a side surface, and a rear surface of the portable electronic device PED. The case CS may be formed of plastic. The display apparatus CDIS, the sound output module SOM, and the image sensor (or a camera) CAM, and the illumination sensor IS may be disposed at the front surface of the case CS. The microphone MIC, the earphone port EP, and the charging port CP may be disposed at one surface of the case CS.

The curved display apparatus CDIS may occupy the most region of the front surface of the portable electronic device PED. The curved display apparatus CDIS will be described in detail with reference to FIG. 4.

The sound output module SOM may be a reception device that outputs a sound of the other party when talking over a telephone. The image sensor CAM may be a device for capturing an image seen in front of the portable electronic device, and another image sensor may be additionally disposed on the rear surface of the portable electronic device PED. The illumination sensor IS may be a device which senses the amount of incident light to control illuminance of the display apparatus DIS. The microphone MIC may be a transmission device which converts a sound wave of a voice of a user into an electrical signal when talking with the other party, and transmits the electrical signal. The speaker SPK may output a sound signal associated with an application or a function executed in the portable electronic device PED. The earphone port EP may be a port which, when a part of an earphone is inserted into the port, outputs a sound signal to the earphone, instead of the speaker SPK. The charging port CP may be a port to which a charger for charging a battery of the portable electronic device PED is connected.

Figure 4:
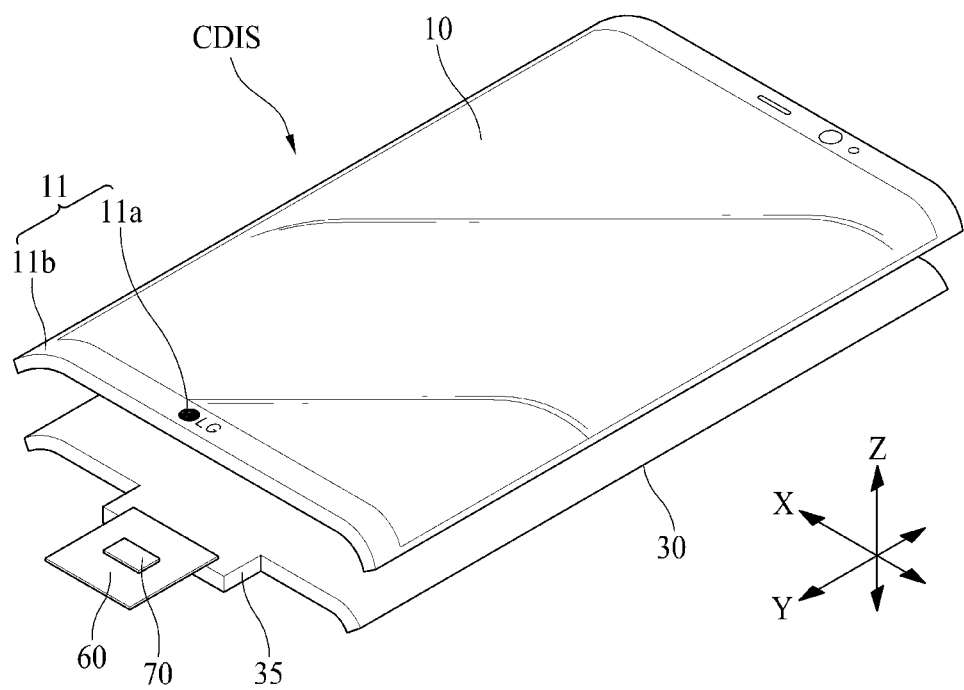
FIG. 4 is an exploded perspective view illustrating a curved display apparatus according to an embodiment of the present disclosure.
Figure 5:
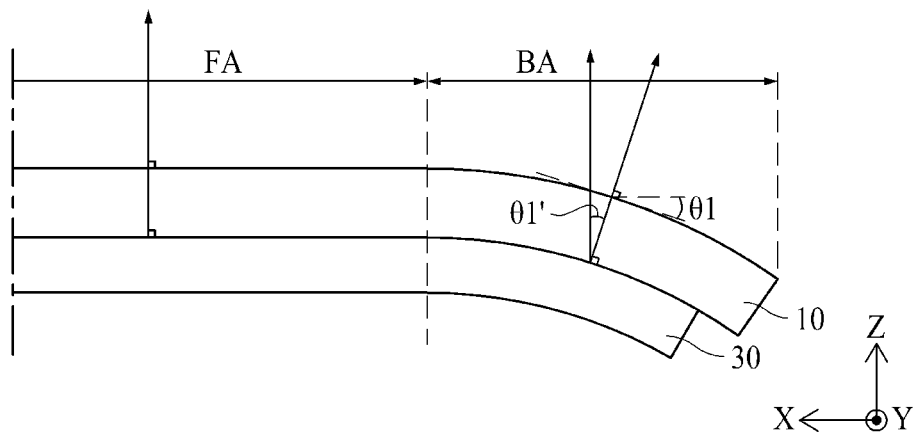
FIG. 5 is a side view illustrating a curved display apparatus according to an embodiment of the present disclosure.

FIG. 4 is an exploded perspective view illustrating a curved display apparatus CDIS according to an embodiment of the present disclosure. FIG. 5 is a side view illustrating the curved display apparatus CDIS according to an embodiment of the present disclosure.

FIG. 5 is a side view of the curved display apparatus when seen in a Y-axis direction. In FIG. 5, for convenience of description, a flexible film 60 and a fully integrated driving circuit 70 are not illustrated.

Referring to FIGS. 4 and 5, the curved display apparatus CDIS according to an embodiment of the present disclosure may include a cover substrate 10, a display module 30, the flexible film 60, and the fully integrated driving circuit 70.

The cover substrate 10 may be formed of plastic, glass, and/or the like.

A decoration layer 11 is provided on the cover substrate 10. The decoration layer 11 may be a layer including a pattern which is seen by a user even when the display module 30 does not display an image. The decoration layer 11 may include a letter pattern 11a and a color layer 11b. The letter pattern 11a may be a logo of a company such as "LG" as in FIG. 4. The color layer 11b may be provided in an area corresponding to a bezel area of the display module 30. In a case where the color layer 11b is provided in black, when the display module 30 does not display an image, the color layer 11b may be shown in the same color as that of a display area of the display module 30, and thus, a screen of the display module 30 is widely seen by a user.

The display module 30 may be disposed on a rear surface of the cover substrate 10. The display module 30 may be a display apparatus which displays a certain image. For example, the display module 30 may be a light emitting display apparatus, but embodiments of the present disclosure are not limited thereto. Examples of the light emitting display apparatus may include organic light emitting display apparatuses, where an organic light emitting layer is used as a light emitting device, and light emitting diode display apparatuses where a micro light emitting diode is used as a light emitting device.

The display module 30 may be attached on the rear surface of the cover substrate 10 by an adhesive film. The adhesive film may be an optically cleared resin (OCR) or an optically cleared adhesive (OCA) film.

A polarization film may be disposed on a front surface of the display module 30. The polarization film prevents visibility from being reduced due to reflection of external light.

A heat dissipation film may be disposed on a rear surface of the display module 30. The heat dissipation film may include a material having high thermal conductivity so as to effectively dissipate heat occurring in the display module 30. Also, the heat dissipation film may perform a buffering function for protecting the display module 30 from an external impact.

The display module 30 may include a protrusion 35 which protrudes from at least a portion of the display module 30. For example, as in FIG. 4, the protrusion 35 may protrude from a portion of a lower side of the display module 30. The flexible film 60 may be attached on the protrusion 35, and in order to minimize the bezel area, the protrusion 35 and the flexible film 60 may be bent and fixed to the rear surface of the display module 30. The flexible film 60 may be a chip-on film (COF) with the fully integrated driving circuit 70 mounted thereon.

The fully integrated driving circuit 70 may be implemented as a chip type like an integrated chip (IC) and may be attached on the flexible film 60 in a chip on film COF type. The fully integrated driving circuit 70 may be a driving circuit into which a data driving circuit, a timing control circuit, a power supply circuit, and a gamma voltage circuit are integrated.

The data driving circuit may be a circuit which generates data voltages from gamma voltages generated by the gamma voltage circuit and supplies the data voltages to data lines of the display module 30, and the timing control circuit may be a circuit which controls an operation timing of the data driving circuit and an operation timing of a scan driving circuit provided in the display module 30. Also, the power supply circuit may be a circuit which generates and supplies driving voltages necessary for the data driving circuit, the timing control circuit, the gamma voltage circuit, and the scan driving circuit. Also, the gamma voltage circuit may be a circuit which supplies the gamma voltages to the data driving circuit.

The curved display apparatus CDIS, as in FIG. 5, may include a flat part FA and a bending part BA. The flat part FA may be flatly provided in a center region of the curved display apparatus CDIS. The bending part BA may extend from at least one side of the flat part FA and may be provided to have a first curvature. Therefore, the bending part BA may be provided in at least one edge of the curved display apparatus CDIS. In FIG. 5, the bending part BA is illustrated as being provided in each of both edges of the curved display apparatus CDIS, but embodiments of the present disclosure are not limited thereto. In other embodiments, the bending part BA may be provided in only one edge of the curved display apparatus CDIS, or may be provided in each of three edges or four edges of the curved display apparatus CDIS.

The display module 30 may be disposed in the flat part FA and the bending part BA of the curved display apparatus CDIS. Since the display module 30 is disposed in the bending part BA of the curved display apparatus CDIS, a user may see an image through the bending part BA.

In the related art, since the display module 30 emits light in a direction vertical to a display surface of each of the flat part FA and the bending part BA, an emission direction of an image displayed by the display module 30 in the bending part BA is inclined at a first angle "θ1" with respect to an emission direction of an image displayed by the display module 30 in the flat part FA. For this reason, in the related art, a user recognizes a luminance difference and a color shift between the flat part FA and the bending part BA of the display module 30.

In the related art, when an angle between the display surface of the flat part FA and the tangent plane at one point of the display surface of the bending part BA is defined as a first angle "θ1", an emission direction of an image in the flat part FA and an emission direction of an image in the bending part BA may have an angle difference, which is substantially the same as the first angle "θ1", or an angle difference "θ1'" which is almost similar to the first angle "θ1". In embodiments of the present disclosure, an image displayed by the display module 30 may emit light in a direction vertical to the display surface in the flat part FA and may emit light at an angle inclined by the first angle "θ1" or the angle "θ1"' similar to the first angle "θ1" from a direction vertical to the display surface in the bending part BA. Therefore, in embodiments of the present disclosure, an emission direction of an image displayed by the display module 30 in the flat part FA may be equal to or almost similar to an emission direction of an image displayed by the display module 30 in the bending part BA. Accordingly, in embodiments of the present disclosure, a luminance difference and a color shift between the flat part FA and the bending part BA of the flexible display apparatus CDIS are prevented from being recognized by a user.

Hereinafter, a method of allowing an emission direction of an image displayed by the display module 30 in the bending part BA to be equal to or almost similar to an emission direction of an image displayed by the display module 30 in the flat part FA will be described in detail with reference to FIGS. 6 to 9.

Figure 6:
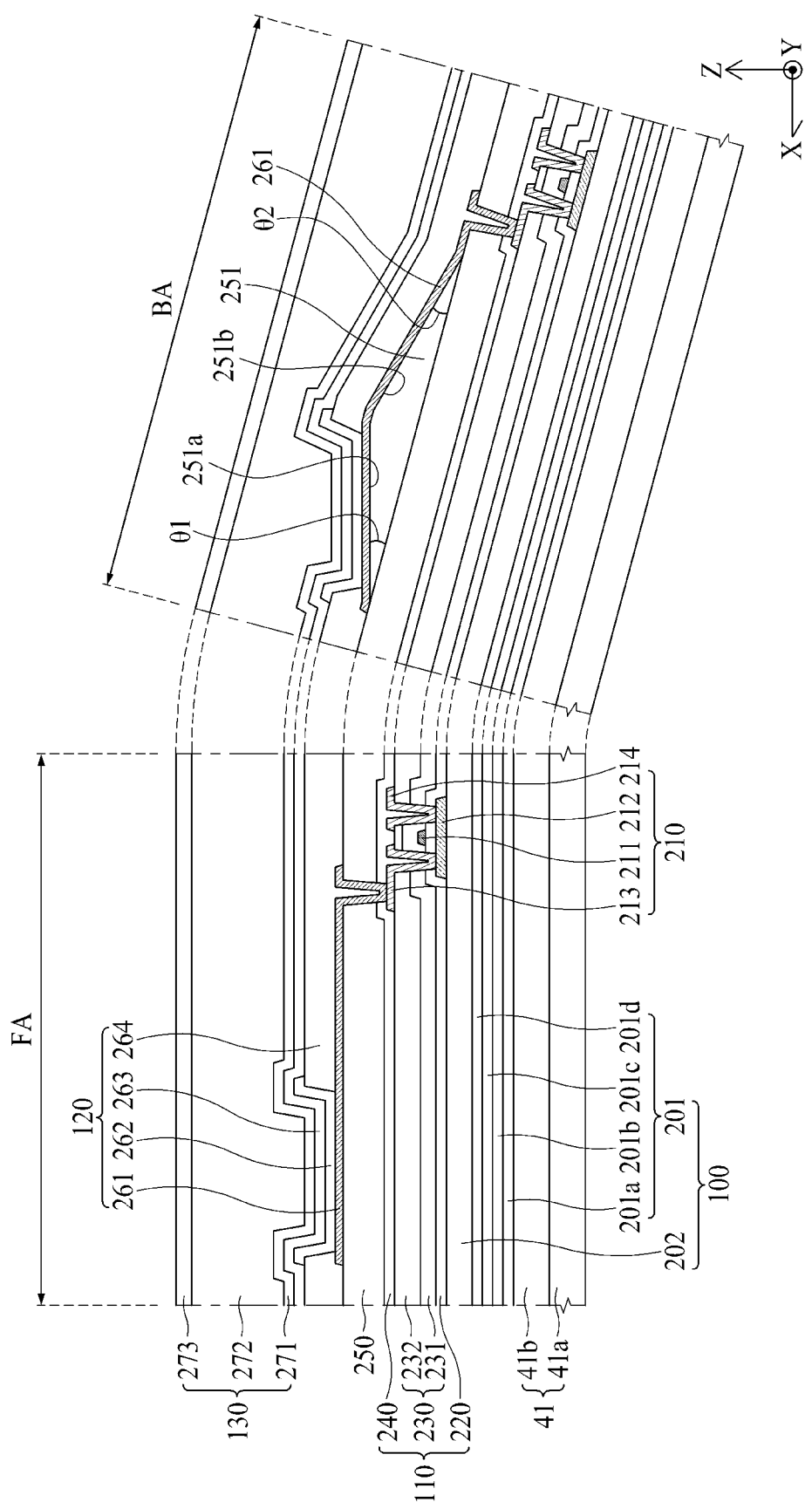
FIG. 6 is a cross-sectional view illustrating an example of a display area disposed in each of a flat part and a bending part of FIG. 5.

FIG. 6 is a cross-sectional view illustrating an example of a display area disposed in each of the flat part and the bending part of FIG. 5.

Referring to FIG. 6, a substrate 41 may include a supporting substrate 41a and a flexible substrate 41b. The supporting substrate 41a may be a substrate for supporting the flexible substrate 41b and may be formed of plastic. For example, the supporting substrate 41a may be formed of polyethylene terephthalate (PET). The flexible substrate 41b may be disposed on the supporting substrate 41a and may be formed of a plastic film having flexibility. For example, the flexible substrate 41b may be formed of a polyimide film.

A buffer layer 100 may be provided on the substrate 41. The buffer layer 100 protects TFTs and light emitting devices from water ($H_2O$) or oxygen ($O_2$) which penetrates into the inside through the substrate 41 vulnerable to penetration of water. The buffer layer 100 may include a multi buffer layer 201 and an active buffer layer 202.

The multi buffer layer 201 may include a plurality of buffer layers (for example, first to fourth buffer layers) 201a to 201d which are alternately stacked. For example, the first and third buffer layers 201a and 201c of the multi buffer layer 201 may each be formed of silicon oxide (SiOx), and the second and fourth buffer layers 201b and 201d may each be formed of silicon nitride (SiNx).

The active buffer layer 202 may be disposed on the multi buffer layer 201. The active buffer layer 202 may be formed of SiOx.

A TFT layer 110 may be provided on the buffer layer 100. TFTs 210, scan lines, data lines, initialization voltage lines, and first high level voltage lines (or first source voltage lines) may be provided on the TFT layer 110.

The TFTs 210 may each include an active layer 212, a gate electrode 211, a source electrode 213, and a drain electrode 214. In FIG. 6, the TFTs 210 are exemplarily illustrated as being formed as a top gate type where the gate electrode 211 is disposed on the active layer 212, but embodiments of the present disclosure are not limited thereto. In other embodiments, the TFTs 210 may be formed as a bottom gate type where the gate electrode 211 is disposed under the active layer 212 or a double gate type where the gate electrode 211 is disposed both on and under the active layer 212.

In FIG. 6, each of the TFTs 210 is illustrated as being provided in a coplanar structure, but embodiments of the present disclosure are not limited thereto. In other embodiments, each of the TFTs 210 may be implemented in an inverted staggered structure using a back channel etched (BCE) process. The coplanar structure may have a top gate structure where a gate electrode is provided on an active layer. The inverted staggered structure may have a bottom gate structure where a gate electrode is provided under an active layer.

The active layer 212 may be provided on the buffer layer 100. The active layer 212 may be formed of a silicon-based semiconductor material, an oxide-based semiconductor material, and/or the like. The silicon-based semiconductor material may use amorphous silicon or polycrystalline silicon which has mobility better than amorphous silicon, is low in consumption power, and is good in reliability.

Examples of the silicon-based semiconductor material may include an InSnGaZnO-based material which is quaternary metal oxide, an InGaZnO-based material, an InSnZnO-based material, an InAlZnO-based material, a SnGaZnO-based material, an AlGaZnO-based material, and a SnAlZnO-based material which are ternary metal oxide, and an InZnO-based material, SnZnO-based material, AlZnO-based material, ZnMgO-based material, SnMgO-based material, InMgO-based material, InGaO-based material, InO-based material, SnO-based material, and ZnO-based material which are binary metal oxide, but a composition ratio of elements is not limited thereto.

The active layer 212 may include a source region and a drain region which include p-type or n-type impurities, and a channel formed between the source region and the drain region, and may include a low concentration doping region between the source region and the drain region adjacent to the channel.

A light blocking layer for blocking external light incident on the active layer 212 may be provided between the buffer layer 100 and the active layer 212.

A gate insulation film 220 may be formed on the active layer 212. The gate insulation filme 220 may be formed of an inorganic layer, and for example, may be formed of SiOx, SiNx, or a multilayer thereof.

The gate electrode 211, the scan lines, and the initialization voltage lines VRL may be provided on the gate insulation film 220. The gate electrode 211, the scan lines, and the initialization voltage lines VRL may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

An interlayer insulation layer 230 may be provided on the gate electrode 211, the scan lines, and the initialization voltage lines. The interlayer insulation layer 230 may include a first interlayer insulation layer 231 and a second interlayer insulation layer 232. The first interlayer insulation layer 231 may be formed of silicon oxide SiOx, and the second interlayer insulation layer 232 may be formed of silicon nitride SiNx.

The source electrode 213, the drain electrode 214, the data lines, and the first high level voltage lines may be provided on the interlayer insulation layer 230. Each of the source electrode 213 and the drain electrode 214 may be connected to the active layer 212 through a conductive via which penetrates through the gate insulation film 220 and the interlayer insulation layer 230. The source electrode 213, the drain electrode 214, and the data lines may each be formed of a single layer or a multilayer which includes one of Mo, Al, Cr, Au, Ti, Ni, Nd, and Cu, or an alloy thereof.

A protection film 240 for insulating the TFTs 210 may be provided on the source electrode 213, the drain electrode 214, the data lines, and the first high level voltage lines. The protection film 240 may be formed of silicon nitride SiNx.

A planarization film 250 for planarizing a step height caused by the TFTs 210 may be formed on the protection film 240. The planarization film 250 may be formed of an organic film such as acryl resin, epoxy resin, phenolic resin, polyamide resin, polyimide resin, or the like.

A slope film 251 may be provided on the planarization film 250 in the bending part BA. The slope film 251 may be a film which is inclined by a certain angle from the planarization film 250. For example, when an angle between a display surface of a flat part FA and the tangent plane at one point of a display surface of a bending part BA is defined as a first angle "θ1", an angle between the planarization film 250 and the slope film 251 at the point of the bending part BA may be substantially the same as the first angle "θ1", or may be an angle "θ1'" similar to the first angle "θ1".

The slope film 251 may include a first surface 251a and a second surface 251b. The first surface 251a of the slope film 251 may be provided to form the first angle "θ1" or the angle "θ1" similar to the first angle "θ1" with respect to an upper surface of the planarization film 250. Therefore, the first surface 251a of the slope film 251 in the bending part BA may be provided in almost parallel with the upper surface of the planarization film 250 in the flat part FA.

The second surface 251b of the slope film 251 may be provided to form a second angle "θ2" with respect to the upper surface of the planarization film 250. The second angle "θ2" may be substantially the same as the first angle "θ1". In this case, the slope film 251 may include a cross-sectional surface of an isosceles triangle where a length of the first surface 251a is the same as that of the second surface 251b.

The slope film 251 may be formed of an organic film such as acryl resin, epoxy resin, phenolic resin, polyamide resin, polyimide resin, or the like. The slope film 251 may be formed of the same material as that of the planarization film 250, or may be formed of the same material as that of a bank 264. When the slope film 251 is formed of the same material as that of the planarization film 250, the slope film 251 may be formed simultaneously with the planarization film 250 as in FIG. 13.

Figure 7:
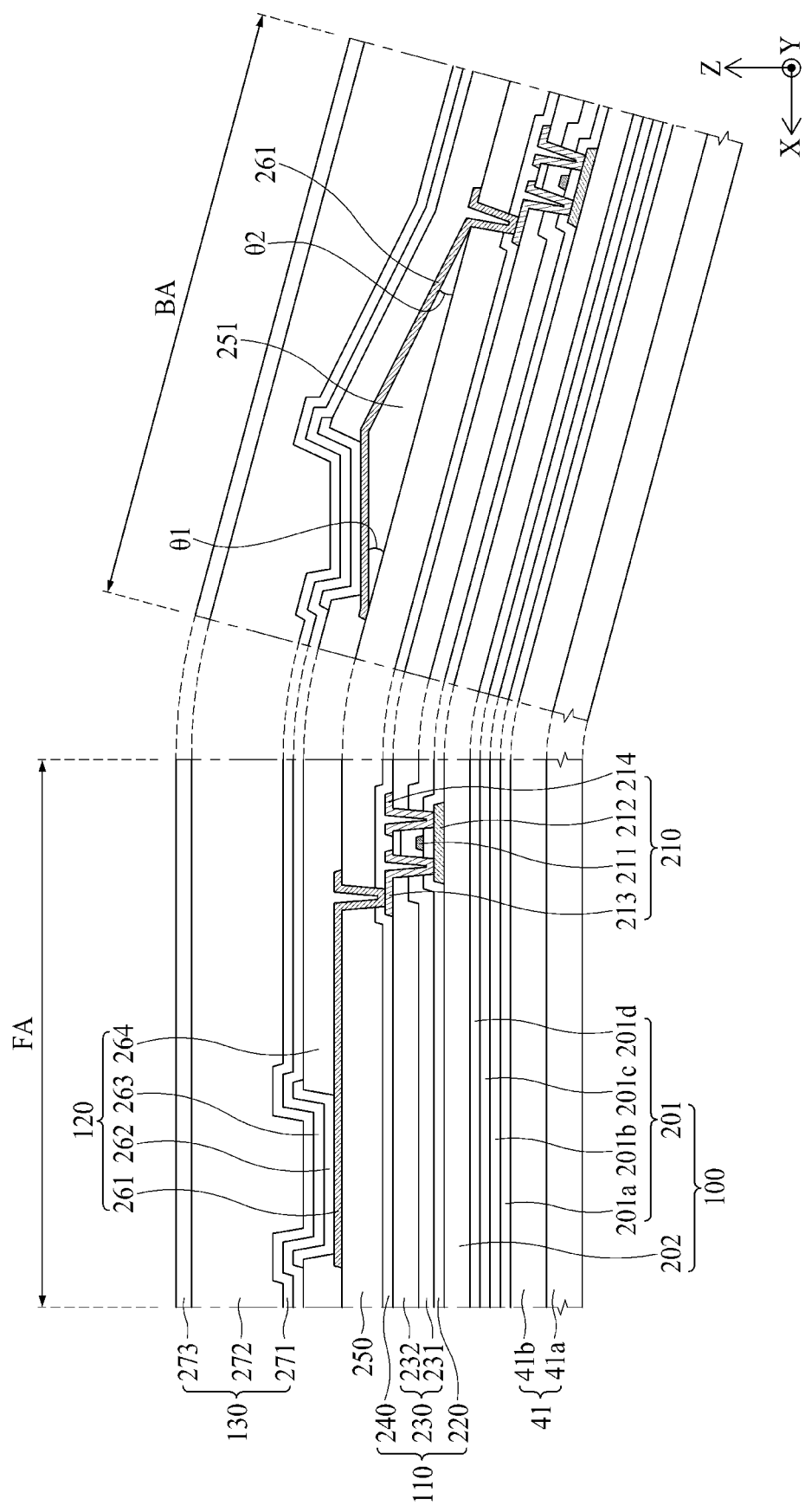
FIG. 7 is a cross-sectional view illustrating another example of the display area disposed in each of the flat part and the bending part of FIG. 5.

A light emitting device layer 120 may be provided on the planarization film 250 of the flat part FA and the slope film 251 of the bending part BA. The light emitting device layer 120 may include a plurality of light emitting devices and the bank 264. In FIG. 7, an example where the light emitting device layer 120 emits light in the top emission type is described, but embodiments of the present disclosure are not limited thereto. In other embodiments, the light emitting device layer 120 may emit light in the bottom emission type.

The light emitting devices and the bank 264 may be provided on the planarization film 250 and the slope film 251. The light emitting devices may include a first electrode 261, a light emitting layer 262, and a second electrode 263. The first electrode 261 may be an anode electrode, and the second electrode 263 may be a cathode electrode.

The first electrode 261 may be provided on the planarization film 250 in the flat part FA and may be provided on the planarization film 250 and the slope film 251 in the bending part BA. In detail, the first electrode 261 may be provided on the planarization film 250 and the first surface 251a of the slope film 251 in the bending part BA.

The first electrode 261 may be connected to the source electrode 213 or the drain electrode 214 of the TFT 210 through a conductive via which penetrates through the protection film 240 and the planarization film 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of silver (Ag), palladium (Pd), and copper (Cu).

In FIG. 6, the first electrode 261 is illustrated as being provided on both the first surface 251a and the second surface 251b of the slope film 251, but embodiments of the present disclosure are not limited thereto. In other embodiments, the first electrode 261 may not be provided on the second surface 251b of the slope film 251. In this case, the first electrode 261 may be connected to the source electrode 213 or the drain electrode 214 of the TFT 210 through a conductive via adjacent to the first surface 251a of the slope film 251.

The bank 264 may be provided on the planarization film 250 and the slope film 251. In detail, the bank 264 may be provided to cover a portion of the first electrode 261 disposed on the planarization film 250 in the flat part FA. The bank 264 may be provided on the planarization film 250 and the first surface 251a and the second surface 251b of the slope film 251 to cover a portion of the first electrode 261 disposed on the first surface 251a of the slope film 251 in the bending part BA.

The bank 264 may define a plurality of emission areas EA. That is, the emission areas EA may each be an area where the first electrode 261, the light emitting layer 262, and the second electrode 263 are sequentially stacked, and a hole from the first electrode 261 and an electron from the second electrode 263 are combined in the light emitting layer 262 to emit light. Therefore, in the bending part BA, the first electrode 261, the light emitting layer 262, and the second electrode 263 sequentially disposed on the first surface 251a of the slope film 251 may be defined as an emission area EA.

Since the first surface 251a of the slope film 251 of the bending part BA is almost parallel to the upper surface of the planarization film 250 of the flat part FA, an emission surface (or a display surface) of an emission area EA in the flat part FA may be almost parallel to an emission surface (or a display surface) of an emission area EA in the bending part BA. Therefore, in embodiments of the present disclosure, an emission direction of an image displayed by the display module 30 in the flat part FA may be equal to or almost similar to an emission direction of an image displayed by the display module 30 in the bending part BA. Accordingly, in embodiments of the present disclosure, a luminance difference and a color shift difference between the flat part FA and the bending part BA of the flexible display apparatus CDIS are prevented from being recognized by a user.

A spacer may be provided on the bank 264. The bank 264 and the spacer may each be formed of an organic film such as acryl resin, epoxy resin, phenolic resin, polyamide resin, polyimide resin, or the like.

The light emitting layer 262 may be provided on the first electrode 261. The light emitting layer 262 may include a hole transport layer (HTL), an organic light emitting layer, and an electron transport layer (ETL). The hole transport layer may smoothly transfer a hole, injected from the first electrode 261, to the organic light emitting layer. The organic light emitting layer may be formed of an organic material including a phosphorescent or fluorescent material. The electron transport layer may smoothly transfer an electron, injected from the second electrode 263, to the organic light emitting layer. The light emitting layer 262 may further include a hole injection layer (HIL), a hole blocking layer (HBL), an electron injection layer (EIL), and an electron blocking layer (EBL), in addition to the hole transport layer, the organic light emitting layer, and the electron transport layer.

Moreover, the light emitting layer 262 may be provided in a tandem structure of two or more stacks. Each of the stacks may include a hole transport layer, an organic light emitting layer, and an electron transport layer. If the light emitting layer 262 is provided in the tandem structure of two or more stacks, a charge generation layer may be provided between adjacent stacks. The charge generation layer may include an n-type charge generation layer, disposed adjacent to a lower stack, and a p-type charge generation layer which is provided on the n-type charge generation layer and is disposed adjacent to an upper stack. The n-type charge generation layer may inject an electron into the lower stack, and the p-type charge generation layer may inject a hole into the upper stack. The n-type charge generation layer may be formed of an organic layer where an organic host material having an ability to transport electrons is doped with alkali metal, such as lithium (Li), sodium (Na), potassium (K), or cesium (Cs), or alkali earth metal such as magnesium (Mg), strontium (Sr), barium (Ba), or radium (Ra). The p-type charge generation layer may be an organic layer where a dopant is doped on an organic host material having an ability to transport holes.

The light emitting layer 262 may be provided in each of the plurality of emission areas EA. In this case, the light emitting layer 262 may be divided into a red light emitting layer which emits red light, a green light emitting layer which emits green light, and a blue light emitting layer which emits blue light, for each of the emission areas EA. However, embodiments of the present disclosure are not limited thereto. In other embodiments, the light emitting layer 262 may be a common layer which is provided in the emission areas EA in common, and in this case, may be a white light emitting layer that emits white light. In a case where the light emitting layer 262 is provided in the emission areas EA in common, a plurality of color filters are needed.

The second electrode 263 may be provided on the light emitting layer 262. The second electrode 263 may be provided to cover the light emitting layer 262. The second electrode 263 may be a common layer which is provided in the pixels in common.

The second electrode 263 may be formed of a transparent conductive oxide (TCO), such as indium tin oxide (ITO) or indium zinc oxide (IZO) capable of transmitting light, or a transflective conductive material such as magnesium (Mg), silver (Ag), or an alloy of Mg and Ag. If the second electrode 263 is formed of a transflective conductive material, emission efficiency is enhanced by a micro-cavity. A capping layer may be formed on the second electrode 263.

An encapsulation film 130 may be provided on the light emitting device layer 120. The encapsulation film 130 prevents oxygen or water from penetrating into the light emitting layer 262 and the second electrode 263. To this end, the encapsulation film 130 may include at least one inorganic film (for example, first and second inorganic films 271 and 273). For example, the at least one inorganic film (271 and 273) may be formed of at least one of silicon nitride, aluminum nitride, zirconium nitride, titanium nitride, hafnium nitride, tantalum nitride, silicon oxide, aluminum oxide, and titanium oxide.

The encapsulation film 130 may include at least one organic film 272 which is formed to have a sufficient thickness, for acting as a particle cover layer which prevents particles from penetrating into the light emitting layer 262 and the second electrode 263. The organic film 272 may be formed of a transparent material for transmitting light emitted from the light emitting layer 262. The organic film 272 may be formed of an organic material for transmitting 99% of the light emitted from the light emitting layer 262, and for example, may be formed of acryl resin, epoxy resin, phenolic resin, polyamide resin, polyimide resin, and/or the like, but is not limited thereto.

In FIG. 6, an example where the first inorganic film 271 is provided on the second electrode 263, the organic film 272 is provided on the first inorganic film 271, and the second inorganic film 273 is provided on the organic film 272 is illustrated, but embodiments of the present disclosure are not limited thereto.

In FIG. 6, an example where the second angle "θ2" between the second surface 251b of the slope film 251 and the upper surface of the planarization film 251 is substantially the same as the first angle "θ1" is illustrated, but embodiments of the present disclosure are not limited thereto. For example, as in FIG. 7, when the second angle "θ2" is less than the first angle "θ1", the slope film 251 may have a triangular cross-sectional surface where a length of the second surface 251b is longer than that of the first surface 251a.

Figure 8:
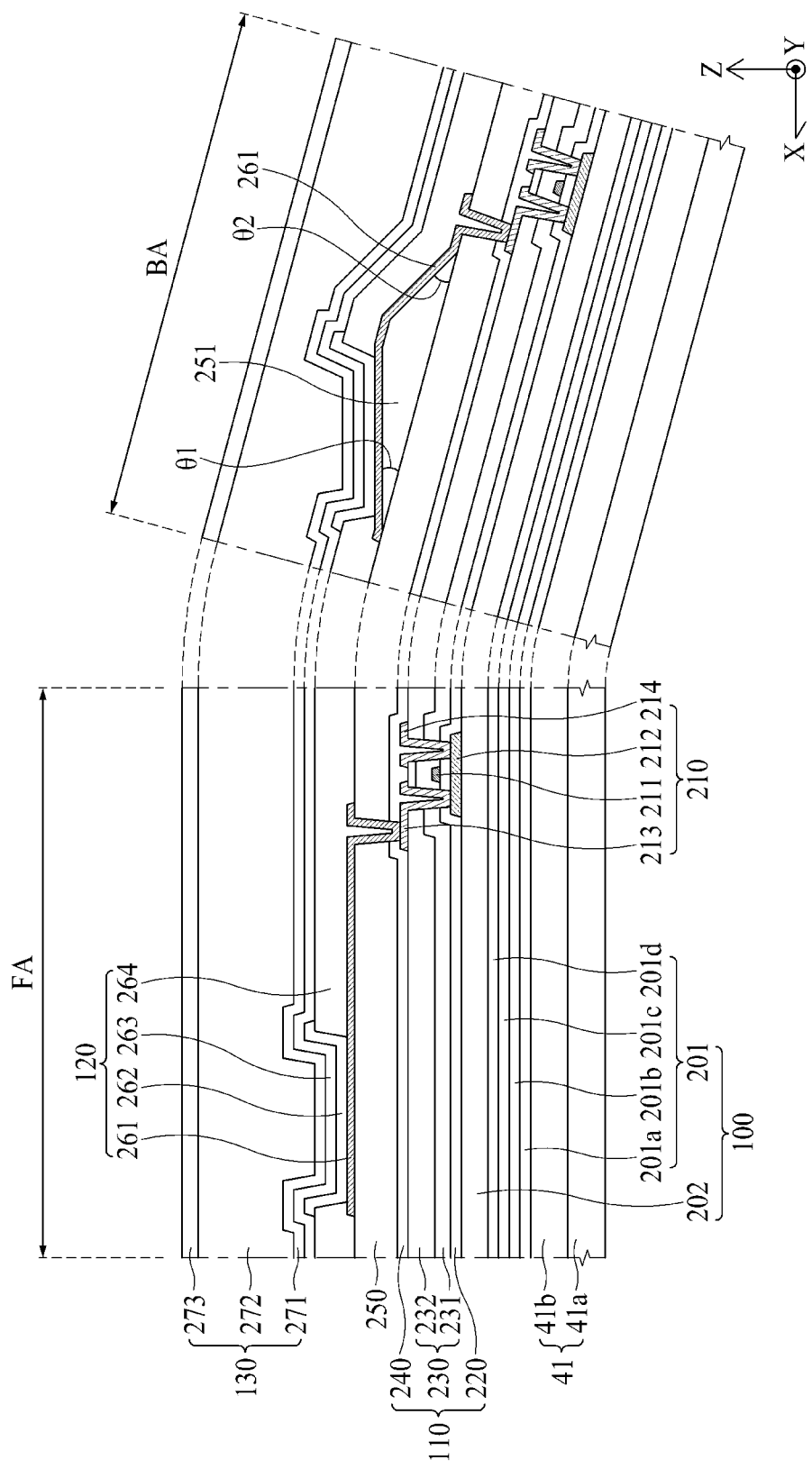
FIG. 8 is a cross-sectional view illustrating another example of the display area disposed in each of the flat part and the bending part of FIG. 5.
Figure 9:
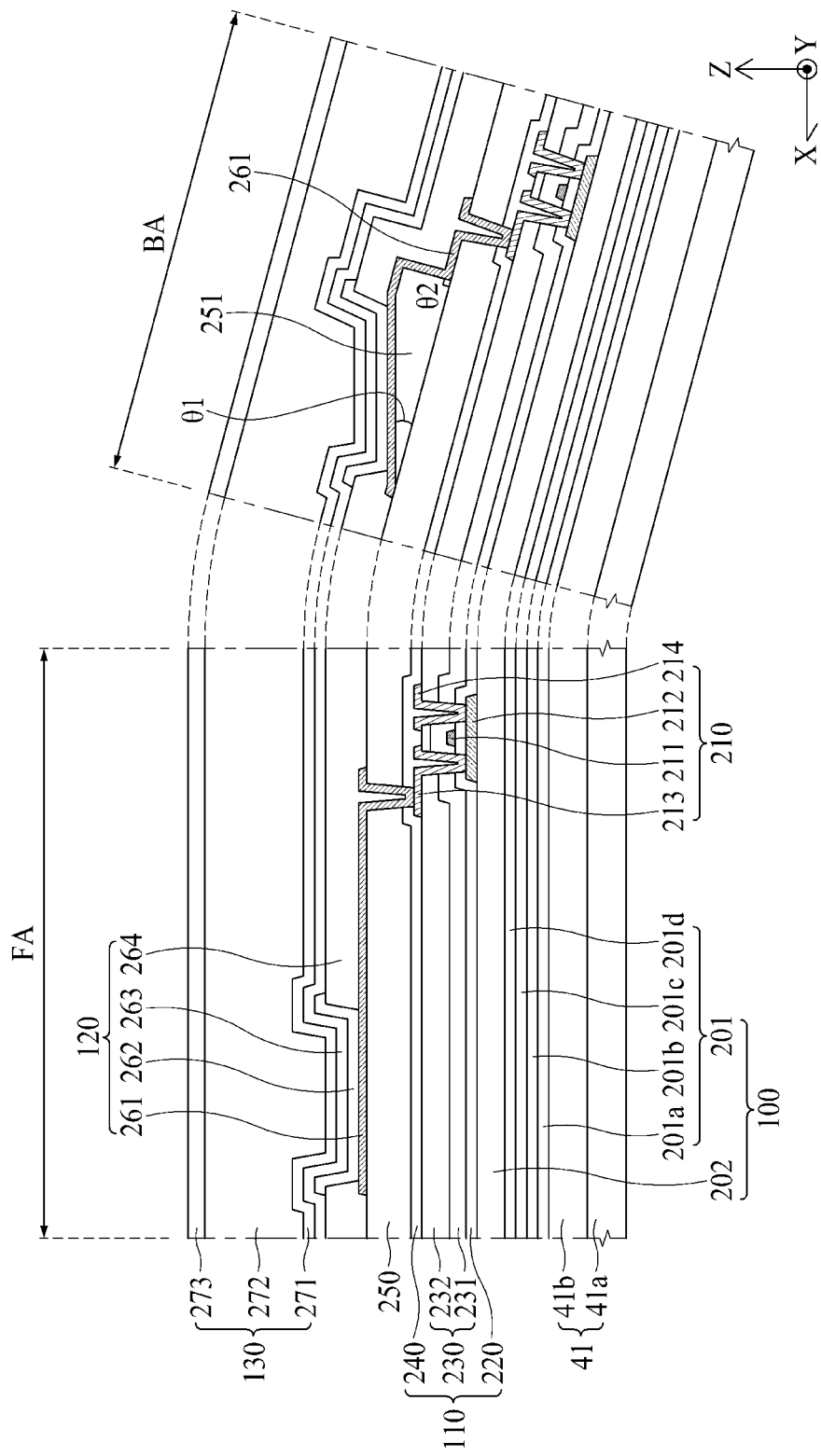
FIG. 9 is a cross-sectional view illustrating another example of the display area disposed in each of the flat part and the bending part of FIG. 5.

Moreover, as in FIG. 8, when the second angle "θ2" is greater than the first angle "θ1", the slope film 251 may have a triangular cross-sectional surface where a length of the first surface 251a is longer than that of the second surface 251b. Also, as in FIG. 9, when the second angle "θ2" is 90 degrees, the slope film 251 may have a right triangular cross-sectional surface. That is, as in FIGS. 8 and 9, when the second angle "θ2" is greater than the first angle "θ1" and is 90 degrees or less, a length of the second surface 251b of the slope film 251 may be shortened, and thus, there is an advantage that a size of a non-emission area may be reduced in comparison with FIG. 6.

Figure 10A:
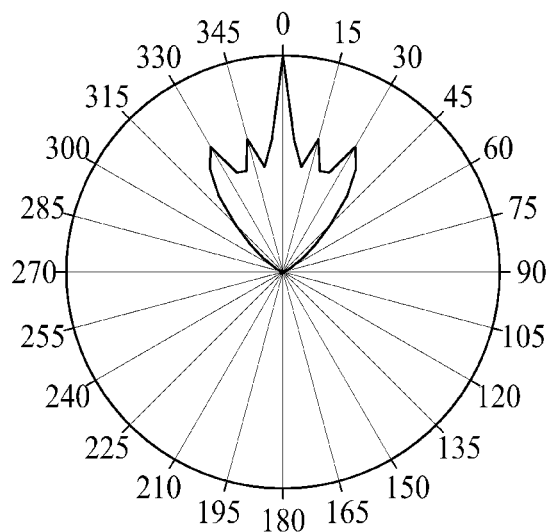
FIGS. 10A and 10B are exemplary diagrams showing a luminance simulation result with respect to a viewing angle in a flat part and a bending part of a display module according to an embodiment of the present disclosure respectively.
Figure 10B:
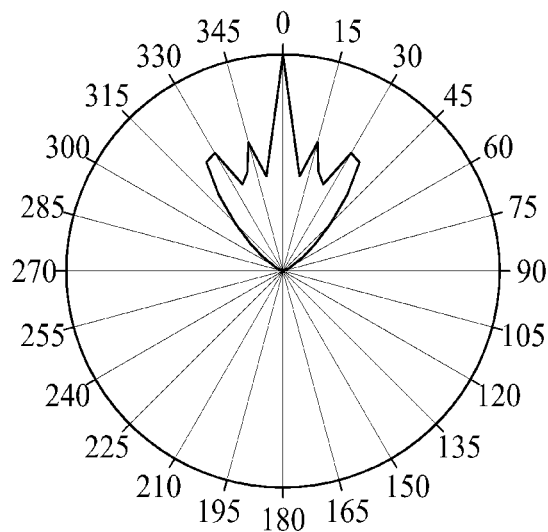

Moreover, FIG. 10A shows a luminance simulation result with respect to a viewing angle in the flat part FA of the display module 30, and FIG. 10B shows a luminance simulation result with respect to a viewing angle in the bending part BA of the display module 30. As in FIGS. 10A and 10B, it may be seen that the luminance simulation result with respect to the viewing angle in the flat part FA of the display module 30 is shown similar to the luminance simulation result with respect to the viewing angle in the bending part BA of the display module 30.

That is, in embodiments of the present disclosure, the first surface 251a of the slope film 251 of the bending part BA may be almost parallel to the upper surface of the planarization film 250, the emission surface (or the display surface) of the emission area EA of the flat part FA may be formed in almost parallel with the emission surface (or the display surface) of the emission area EA of the bending part BA. Therefore, in embodiments of the present disclosure, an emission direction of an image displayed by the display module 30 in the flat part FA may be equal to or almost similar to an emission direction of an image displayed by the display module 30 in the bending part BA. Accordingly, in embodiments of the present disclosure, a luminance difference and a color shift between the flat part FA and the bending part BA of the flexible display apparatus CDIS are prevented from being recognized by a user.

In FIG. 5, when a curvature of the bending part BA increases as a distance to the flat part FA increases, a difference between an emission direction of an image in the flat part and an emission direction of an image in the bending part increases. Therefore, the first angle "θ1" of the slope film 251 provided in each of emission areas EA of the bending part BA may increase as a distance to the flat part FA increases, so that an emission direction of an image displayed by the display module 30 in the flat part FA is equal to or almost similar to an emission direction of an image displayed by the display module 30 in the bending part BA.

Moreover, in FIG. 5, when a curvature of the bending part BA decreases as a distance to the flat part FA increases, a difference between an emission direction of an image in the flat part and an emission direction of an image in the bending part decreases. Therefore, the first angle "θ1" of the slope film 251 provided in each of emission areas EA of the bending part BA may decrease as a distance to the flat part FA increases, so that an emission direction of an image displayed by the display module 30 in the flat part FA is equal to or almost similar to an emission direction of an image displayed by the display module 30 in the bending part BA.

Figure 11:
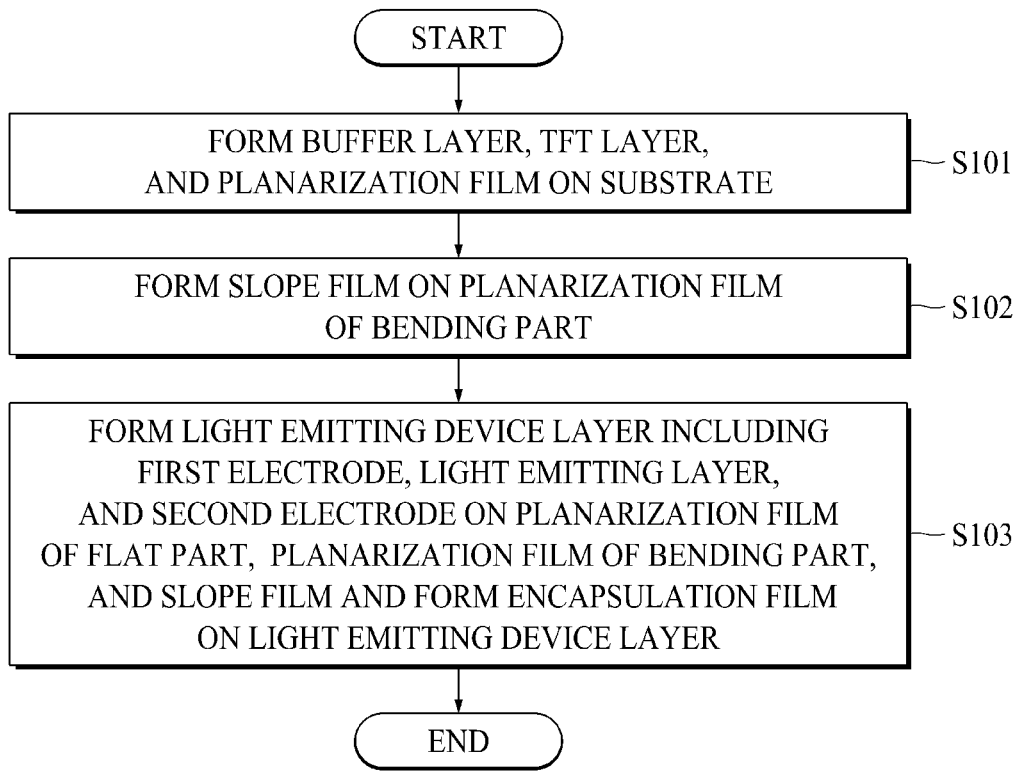
FIG. 11 is a flowchart illustrating a method of manufacturing a display module according to an embodiment of the present disclosure.

FIG. 11 is a flowchart illustrating a method of manufacturing a display module according to an embodiment of the present disclosure. FIGS. 12A to 12D are cross-sectional views for describing a method of manufacturing a display module according to an embodiment of the present disclosure.

Figure 12A:
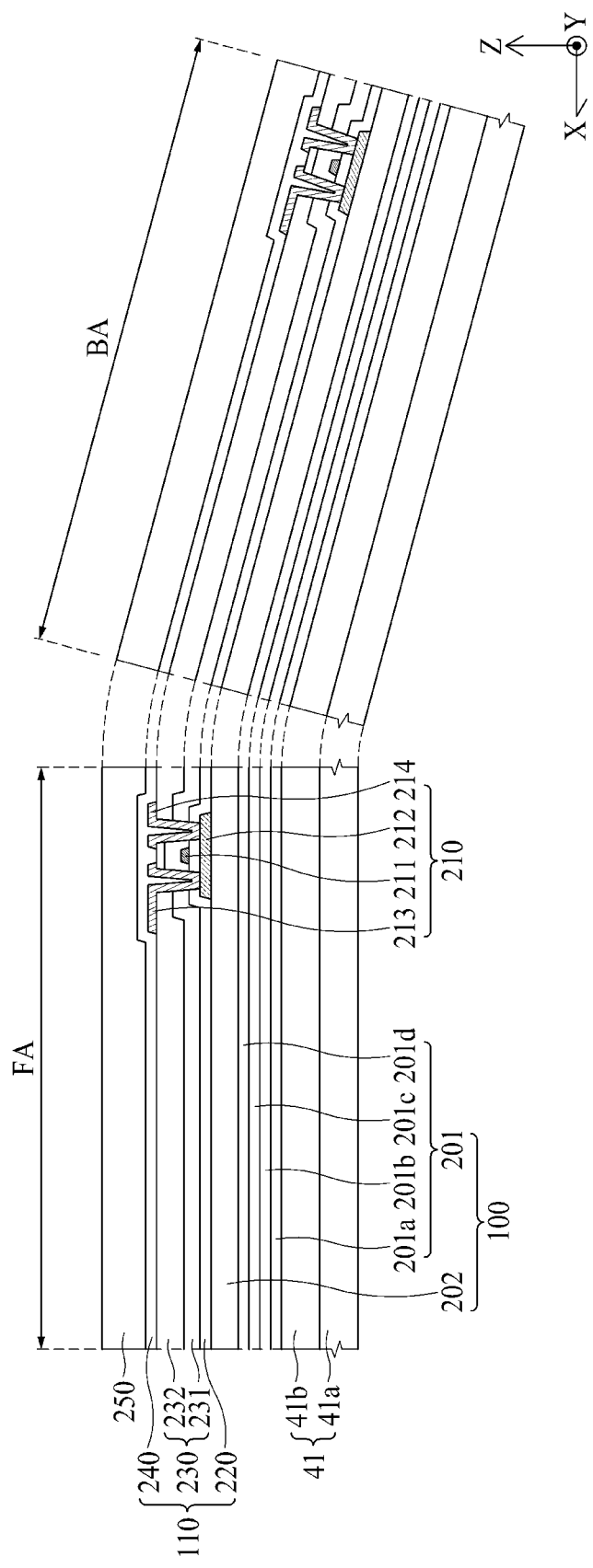
FIGS. 12A to 12D are cross-sectional views for describing a method of manufacturing a display module according to an embodiment of the present disclosure.

First, as in FIG. 12A, a buffer layer 100, a TFT layer 110, and a planarization film 250 may be formed on a substrate 41. The buffer layer 100, the TFT layer 110, and the planarization film 250 may be formed in common in a flat part FA and a bending part BA. (S101 of FIG. 11)

In detail, the buffer layer 100 may be provided on the substrate 41. The buffer layer 100 protects TFTs and light emitting devices from water ($H_2O$) or oxygen ($O_2$) which penetrates into the inside through the substrate 41 vulnerable to penetration of water.

The buffer layer 100 may include a multi buffer layer 201 and an active buffer layer 202. The multi buffer layer 201 may include a plurality of buffer layers (for example, first to fourth buffer layers) 201a to 201d which are alternately stacked. For example, the first and third buffer layers 201a and 201c of the multi buffer layer 201 may each be formed of silicon oxide (SiOx), and the second and fourth buffer layers 201b and 201d may each be formed of silicon nitride (SiNx). The active buffer layer 202 may be disposed on the multi buffer layer 201. The active buffer layer 202 may be formed of silicon oxide SiOx.

Subsequently, an active layer 212 of each of the TFTs may be formed on the buffer layer 100. In detail, an active metal layer may be formed on a front surface of the buffer layer 100 through a sputtering process or a metal organic chemical vapor deposition (MOCVD) process. Subsequently, the active layer 212 may be formed by patterning the active metal layer through a mask process using a photoresist pattern. The active layer 212 may be formed of a silicon-based semiconductor material, an oxide-based semiconductor material, and/or the like.

The active layer 212 may be formed of a silicon-based semiconductor material, an oxide-based semiconductor material, and/or the like. The silicon-based semiconductor material may use amorphous silicon or polycrystalline silicon which has mobility better than amorphous silicon, is low in consumption power, and is good in reliability.

Examples of the silicon-based semiconductor material may include an InSnGaZnO-based material which is quaternary metal oxide, an InGaZnO-based material, an InSnZnO-based material, an InAlZnO-based material, a SnGaZnO-based material, an AlGaZnO-based material, and a SnAlZnO-based material which are ternary metal oxide, and an InZnO-based material, SnZnO-based material, AlZnO-based material, ZnMgO-based material, SnMgO-based material, InMgO-based material, InGaO-based material, InO-based material, SnO-based material, and ZnO-based material which are binary metal oxide, but a composition ratio of elements is not limited thereto.

The active layer 212 may include a source region and a drain region which include p-type or n-type impurities, and a channel formed between the source region and the drain region, and may include a low concentration doping region between the source region and the drain region adjacent to the channel.

A light blocking layer for blocking external light incident on the active layer 212 may be provided between the buffer layer 100 and the active layer 212.

Subsequently, a gate insulation film 220 may be formed on the active layer 212. The gate insulation film 220 may be formed of an inorganic film, and for example, may be formed of silicon oxide SiOx, silicon nitride SiNx, or a multilayered film thereof.

Subsequently, a gate electrode 211 of a TFT 210 and scan lines may be formed on the gate insulation film 220. In detail, a first metal layer may be formed on a front surface of the gate insulation film 220 through a sputtering process or an MOCVD process. Subsequently, the gate electrode 211 may be formed by patterning the first metal layer through a mask process using a photoresist pattern. The gate electrode 211 may be formed of a single layer or a multilayer which includes one of Mo, Al, Cr, Au, Ti, Ni, Nd, and Cu, or an alloy thereof.

Subsequently, an interlayer insulation film 230 may be formed on the gate electrode 211 and the scan lines. The interlayer insulation film 230 may include a first interlayer insulation film 231 and a second interlayer insulation film 232. The first interlayer insulation film 231 may be formed of silicon oxide SiOx, and the second interlayer insulation film 232 may be formed of silicon nitride SiNx.

Subsequently, a plurality of conductive vias which pass through the gate insulation film 220 and the interlayer insulation film 230 and expose the active layer 212 may be formed.

Subsequently, a source electrode 213, a drain electrode 214, and data lines may be formed on the interlayer insulation film 230. In detail, a second metal layer may be formed on a front surface of the interlayer insulation film 230 through a sputtering process or an MOCVD process. Subsequently, the source electrode 213, the drain electrode 214, and the data lines may be formed by patterning the second metal layer through a mask process using a photoresist pattern. The source electrode 213 may be connected to one side of the active layer 212 through a conductive via which penetrates through the gate insulation film 220 and the interlayer insulation film 230. The drain electrode 214 may be connected to the other side of the active layer 212 through a conductive via which penetrates through the gate insulation film 220 and the interlayer insulation film 230. The source electrode 213, the drain electrode 214, and the data lines may each be formed of a single layer or a multilayer which includes one of Mo, Al, Cr, Au, Ti, Ni, Nd, and Cu, or an alloy thereof.

Subsequently, a protection film 240 for insulating the TFT 210 may be formed on the source electrode 213, the drain electrode 214, and the data lines. The protection film 240 may be formed of SiNx.

Subsequently, a planarization film 250 for planarizing a step height caused by the TFT 210 may be formed on the protection film 240. The planarization film 250 may be formed of an organic film such as acryl resin, epoxy resin, phenolic resin, polyamide resin, polyimide resin, or the like.

Figure 12B:
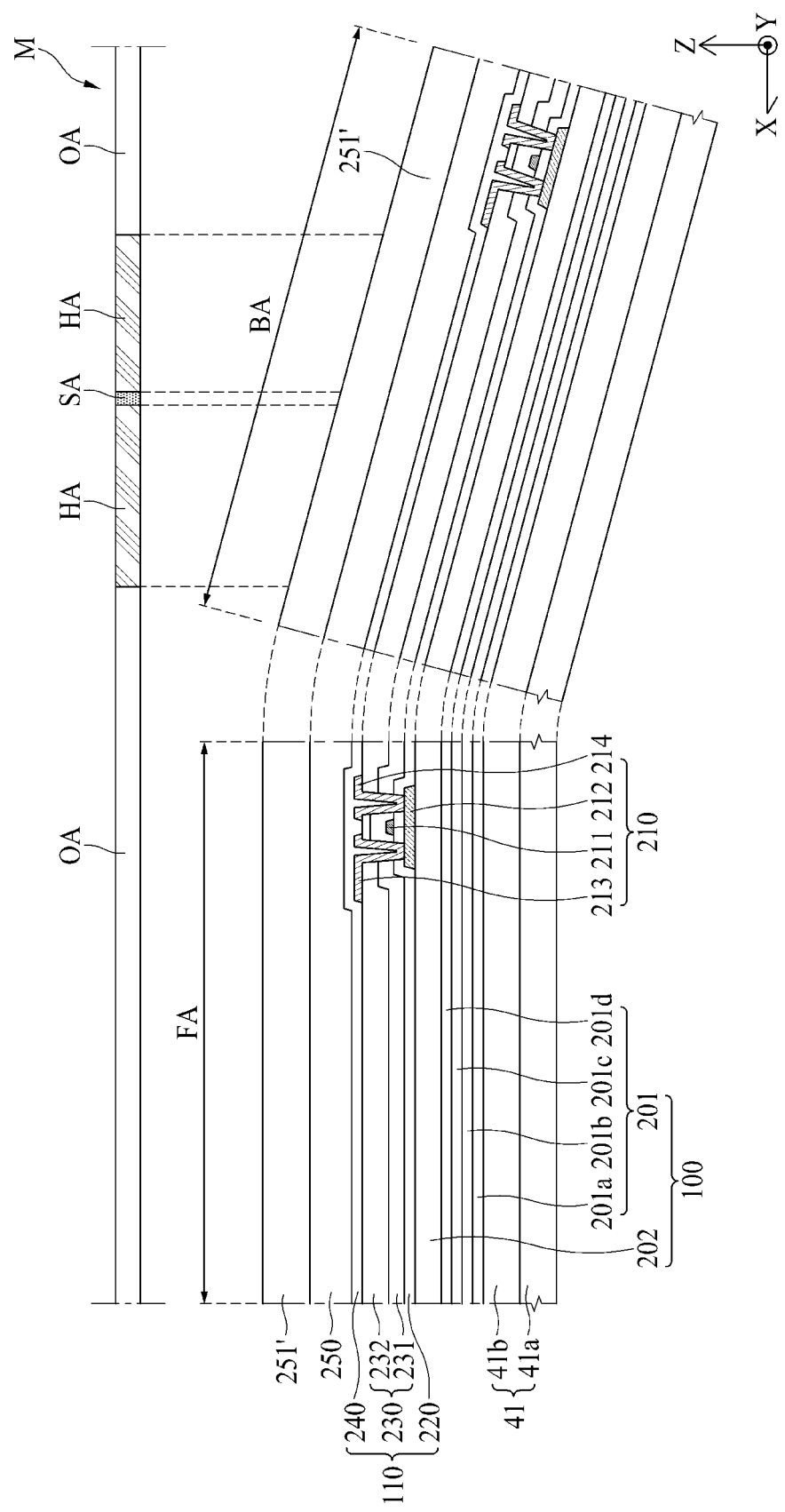
Figure 12C:
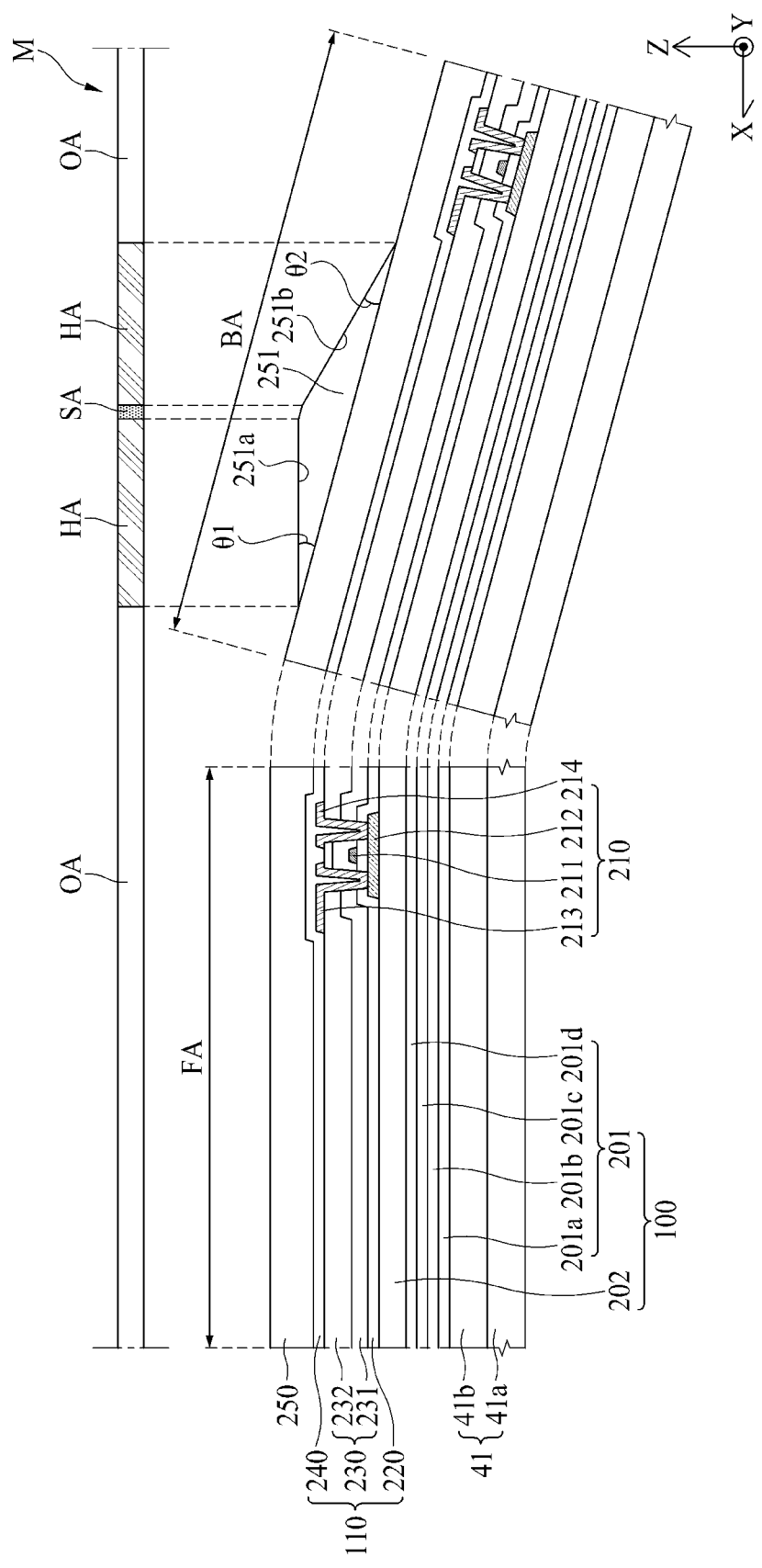

Second, as in FIGS. 12B and 12C, a slope film 251 may be formed on the planarization film 250 of the bending part BA. (S102 of FIG. 11)

In FIGS. 12B and 12C, an example where an organic film 251' for forming the slope film 251 has a positive resist characteristic where a portion exposed to light is dissolved by a developing solution is mainly described.

In detail, as in FIG. 12B, in the flat part FA and the bending part BA, the organic film 251' may be formed on the planarization film 250, and a mask M may be disposed on the organic film 251'. The organic film 251' may be formed of acryl resin, epoxy resin, phenolic resin, polyamide resin, polyimide resin, or the like, and for example, preferably may be formed of photo acryl capable of a photo process.

The mask M may include an opening part OA, a halftone part HA, and a light blocking part SA. The opening part OA, as in FIG. 12B, may be disposed in a whole region of the flat part FA and a region, where the slope film 251 is not to be formed, of the bending part BA. Also, as in FIG. 12B, the halftone part HA may be disposed in regions corresponding to zones where the first surface 251a and the second surface 251b of the slope film 251 are to be formed, and the light blocking part SA may be disposed in a boundary between the regions corresponding to the zones where the first surface 251a and the second surface 251b of the slope film 251 are to be formed.

The mask M may be disposed on the organic film 251', and then, by performing an exposure process and a development process, the slope film 251 may be formed as in FIG. 12C. Since the organic film 251' disposed in the opening part OA is fully exposed to light, the organic film 251' may be removed through the development process. Since the organic film 251' disposed in the light blocking part SA is not exposed to light, the organic film 251' may not be removed through the development process. Since only a portion of an upper portion of the organic film 251' disposed in the halftone part HA is exposed to light, only the portion, exposed to the light, of the upper portion of the organic film 251' may be removed through the development process. The halftone part HA may be disposed between the opening part OA and the light blocking part SA, and thus, the organic film 251' may be formed to have a height which increases in a direction from the opening part OA to the light blocking part SA. Therefore, as in FIG. 12C, the first surface 251a of the slope film 251 may be provided to form a first angle "θ1" with respect to an upper surface of the planarization film 250, and the second surface 251b of the slope film 251 may be provided to form a second angle "θ2" with respect to the upper surface of the planarization film 250.

When the organic film 251' has a negative characteristic where a portion unexposed to light is dissolved by a developing solution, the light blocking part SA may be disposed in a whole region of the flat part FA and a region, where the slope film 251 is not to be formed, of the bending part BA. Also, the halftone part HA may be disposed on the first surface 251a and the second surface 251b of the slope film 251, and the opening part OA may be disposed in a boundary between the first surface 251a and the second surface 251b of the slope film 251.

The first angle "θ1" between the first surface 251a of the slope film 251 and the upper surface of the planarization film 250 and the second angle "θ2" between the second surface 251b of the slope film 251 and the upper surface of the planarization film 250 may be adjusted based on a distance between the respective opening part OA and the light blocking part SA. For example, if the distance between the respective opening part OA and the light blocking part SA increases, the first angle "θ1" and the second angle "θ2" may decrease. Also, if the distance between the respective opening part OA and the light blocking part SA decreases, the first angle "θ1" and the second angle "θ2" may increase.

Figure 12D:
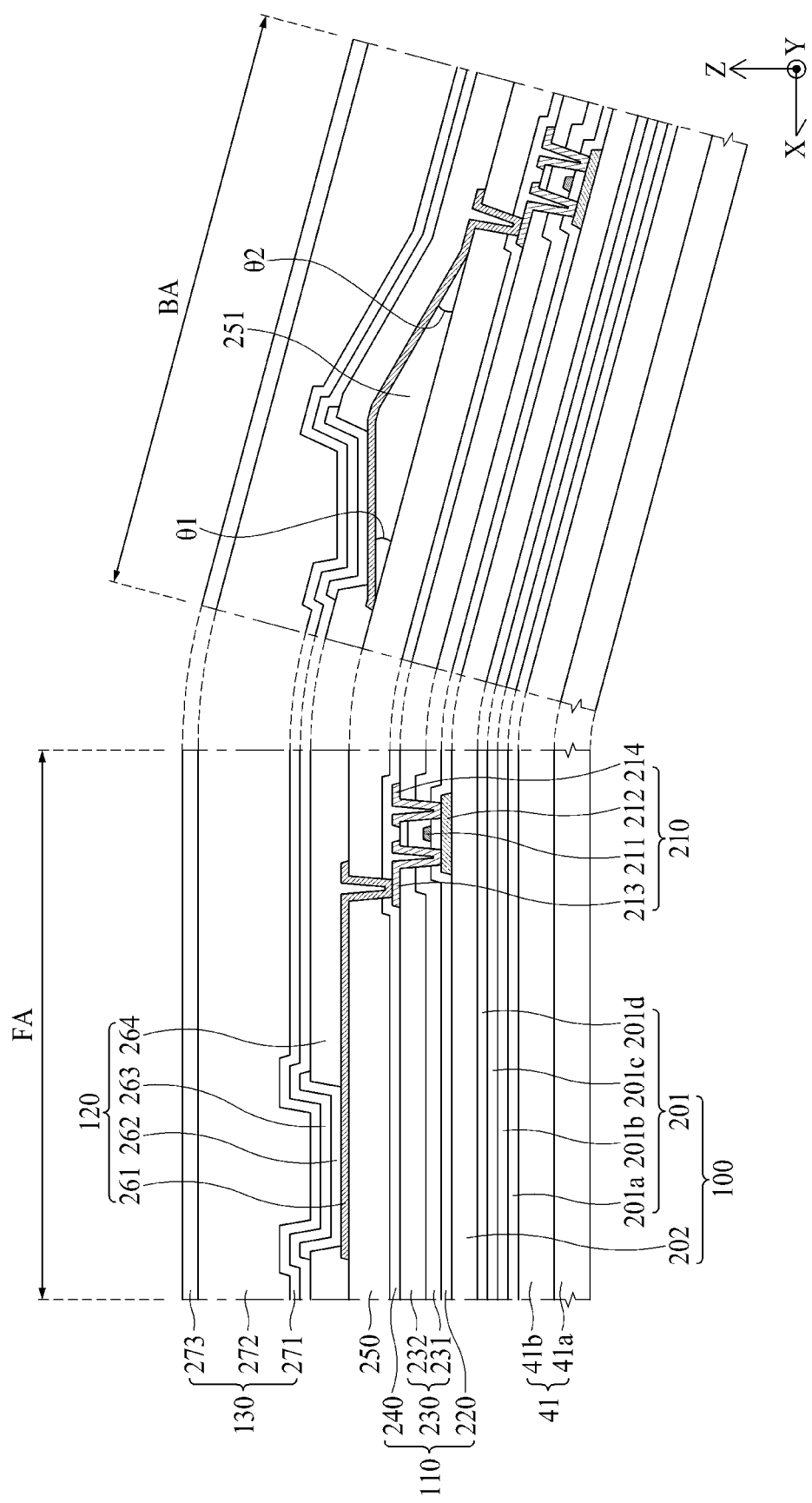

Third, as in FIG. 12D, a light emitting device layer 120 including a first electrode 261, an organic light emitting layer (or a light emitting layer) 262, and a second electrode 263 may be formed on the planarization film 250 of the flat part FA and the planarization film 250 and the slope film 251 of the bending part BA, and an encapsulation film 130 may be formed on the light emitting device layer 120. (S103 of FIG. 11)

The first electrode 261 may be formed on the planarization film 250 of the flat part FA and the planarization film 250 and the slope film 251 of the bending part BA. In detail, a third metal layer may be formed on a front surface of each of the planarization film 250 of the flat part FA and the planarization film 250 and the slope film 251 of the bending part BA through a sputtering process or an MOCVD process. Subsequently, the first electrode 261 may be formed by patterning the third metal layer through a mask process using a photoresist pattern.

The first electrode 261 may be formed on the planarization film 250 and the first surface 251a and the second surface 251b of the slope film 251 in the bending part BA. The first electrode 261 may be connected to the source electrode 213 or the drain electrode 214 of the TFT 210 through a conductive via which penetrates through the protection film 240 and the planarization film 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

Subsequently, a bank 264 may be formed on the planarization film 250 and the slope film 251. In detail, an organic film may be formed on the planarization film 250 and the slope film 251, and the bank 264 may be formed by patterning the organic film through an exposure process and a development process.

The bank 264 may be formed to cover a portion of the first electrode 261 disposed on the planarization film 250 in the flat part FA. The bank 264 may be formed on the planarization film 250 and the first surface 251a and the second surface 251b of the slope film 251 to cover a portion of the first electrode 261 disposed on the first surface 251a of the slope film 251 in the bending part BA.

A spacer may be formed on the bank 264. The bank 264 and the spacer may each be formed of an organic film such as acryl resin, epoxy resin, phenolic resin, polyamide resin, polyimide resin, or the like.

Subsequently, the light emitting layer 262 may be formed on the first electrode 261. In detail, the light emitting layer 262 may be formed on the first electrode 261 and the bank 264 through a deposition process or a solution process.

The light emitting layer 262 may be formed in each of the plurality of emission areas EA. In this case, the light emitting layer 262 may be divided into a red light emitting layer which emits red light, a green light emitting layer which emits green light, and a blue light emitting layer which emits blue light, for each of the emission areas EA. However, embodiments of the present disclosure are not limited thereto. In other embodiments, the light emitting layer 262 may be a common layer which is provided in the emission areas EA in common, and in this case, may be a white light emitting layer that emits white light. In a case where the light emitting layer 262 is provided in the emission areas EA in common, a plurality of color filters are needed.

Subsequently, the second electrode 263 may be formed on the light emitting layer 262. The second electrode 263 may be a common layer which is provided in a plurality of pixels P in common. The second electrode 263 may be formed of a transparent conductive oxide TCO, such as indium tin oxide (ITO) or indium zinc oxide (IZO) capable of transmitting light, or a transflective conductive material such as magnesium (Mg), silver (Ag), or an alloy of Mg and Ag. If the second electrode 263 is formed of a transflective conductive material, emission efficiency is enhanced by a micro-cavity. The second electrode 263 may be formed through a physical vapor deposition process such as a sputtering process. A capping layer may be formed on the second electrode 263.

Subsequently, the encapsulation film 130 may be formed on the second electrode 263. The encapsulation film 130 prevents oxygen or water from penetrating into the light emitting layer 262 and the second electrode 263. To this end, the encapsulation film 130 may include at least one inorganic film (for example, first and second inorganic films 271 and 273). For example, the at least one inorganic film (271 and 273) may be formed of at least one of silicon nitride, aluminum nitride, zirconium nitride, titanium nitride, hafnium nitride, tantalum nitride, silicon oxide, aluminum oxide, and titanium oxide.

The encapsulation film 130 may include at least one organic film 272 which is formed to have a sufficient thickness, for acting as a particle cover layer which prevents particles from penetrating into the light emitting layer 262 and the second electrode 263. The organic film 272 may be formed of a transparent material for transmitting light emitted from the light emitting layer 262. The organic film 272 may be formed of an organic material for transmitting 99% of the light emitted from the light emitting layer 262, and for example, may be formed of acryl resin, epoxy resin, phenolic resin, polyamide resin, polyimide resin, and/or the like, but is not limited thereto.

As described above, in embodiments of the present disclosure, the slope film 251 which is inclined by the first angle "θ1" from the planarization film 250 may be formed in the bending part BA by using the halftone mask. Therefore, in embodiments of the present disclosure, since the first surface 251a of the slope film 251 of the bending part BA is almost parallel to the upper surface of the planarization film 250 of the flat part FA, an emission surface (or a display surface) of the emission area EA in the flat part FA may be provided in almost parallel with an emission surface (or a display surface) of the emission area EA in the bending part BA. Accordingly, in embodiments of the present disclosure, an emission direction of an image displayed by the display module 30 in the flat part FA may be equal to or almost similar to an emission direction of an image displayed by the display module 30 in the bending part BA. As a result, in embodiments of the present disclosure, a luminance difference and a color shift between the flat part FA and the bending part BA of the flexible display apparatus CDIS are prevented from being recognized by a user.

Figure 13:
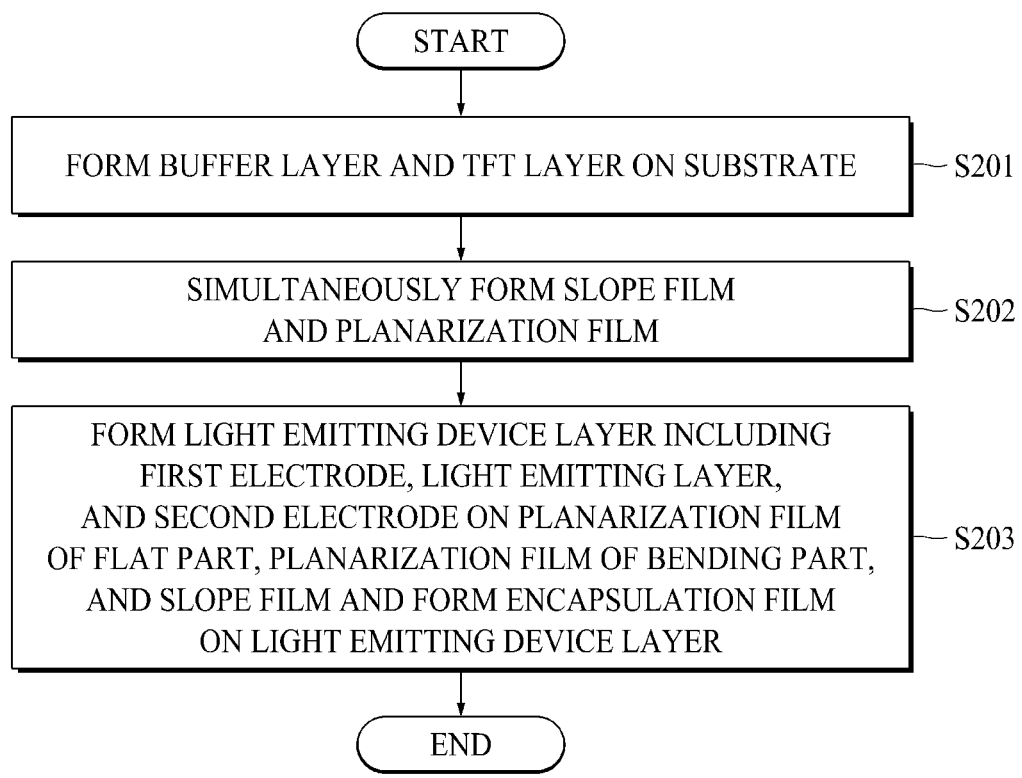
FIG. 13 is a flowchart illustrating a method of manufacturing a display module according to another embodiment of the present disclosure.

FIG. 13 is a flowchart illustrating a method of manufacturing a display module according to another embodiment of the present disclosure. FIGS. 14A to 14D are cross-sectional views for describing a method of manufacturing a display module according to another embodiment of the present disclosure.

Figure 14A:
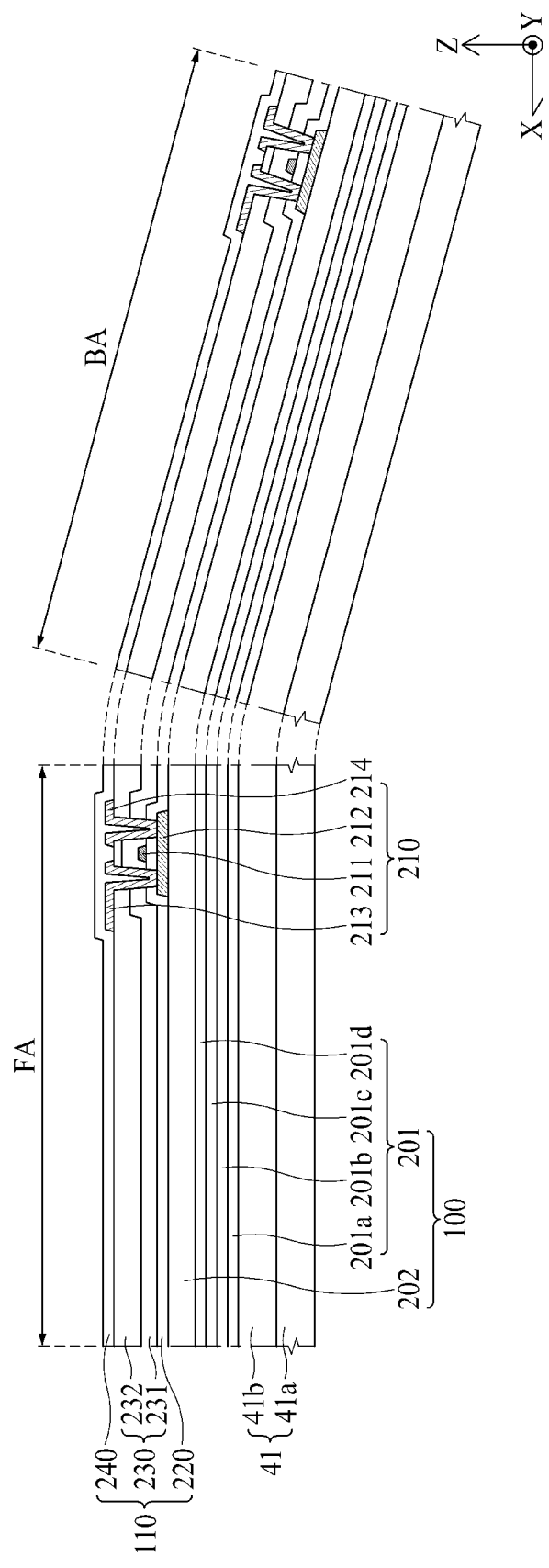
FIGS. 14A to 14D are cross-sectional views for describing a method of manufacturing a display module according to another embodiment of the present disclosure.

First, as in FIG. 14A, a buffer layer 100 and a TFT layer 110 may be formed on a substrate 41. The buffer layer 100 and the TFT layer 110 may be formed in common in a flat part FA and a bending part BA. (S201 of FIG. 13)

Step S201 is substantially the same as step S101 described above with reference to FIS. 11 and 12A, and thus, a detailed description of step S201 is omitted.

Figure 14B:
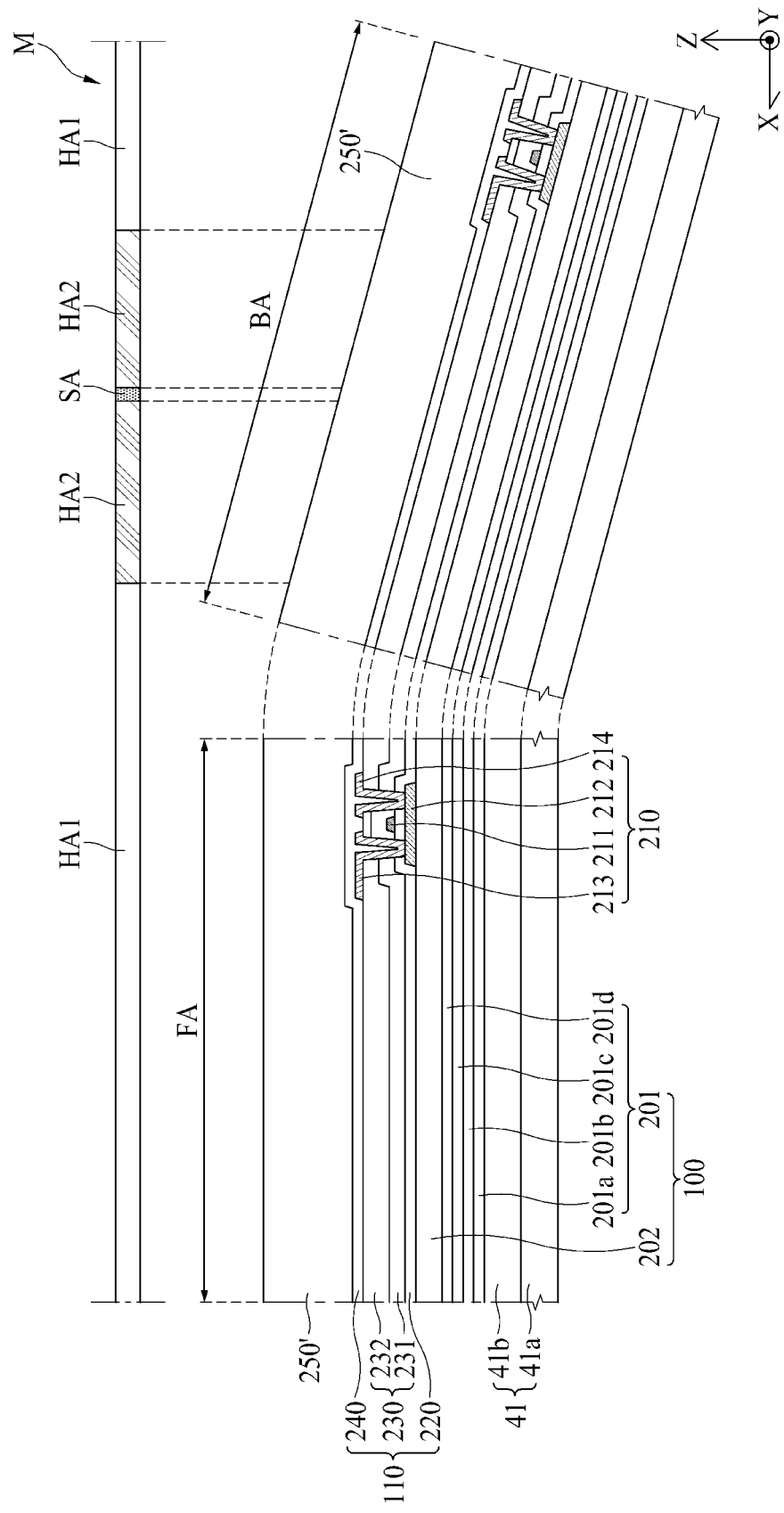
Figure 14C:
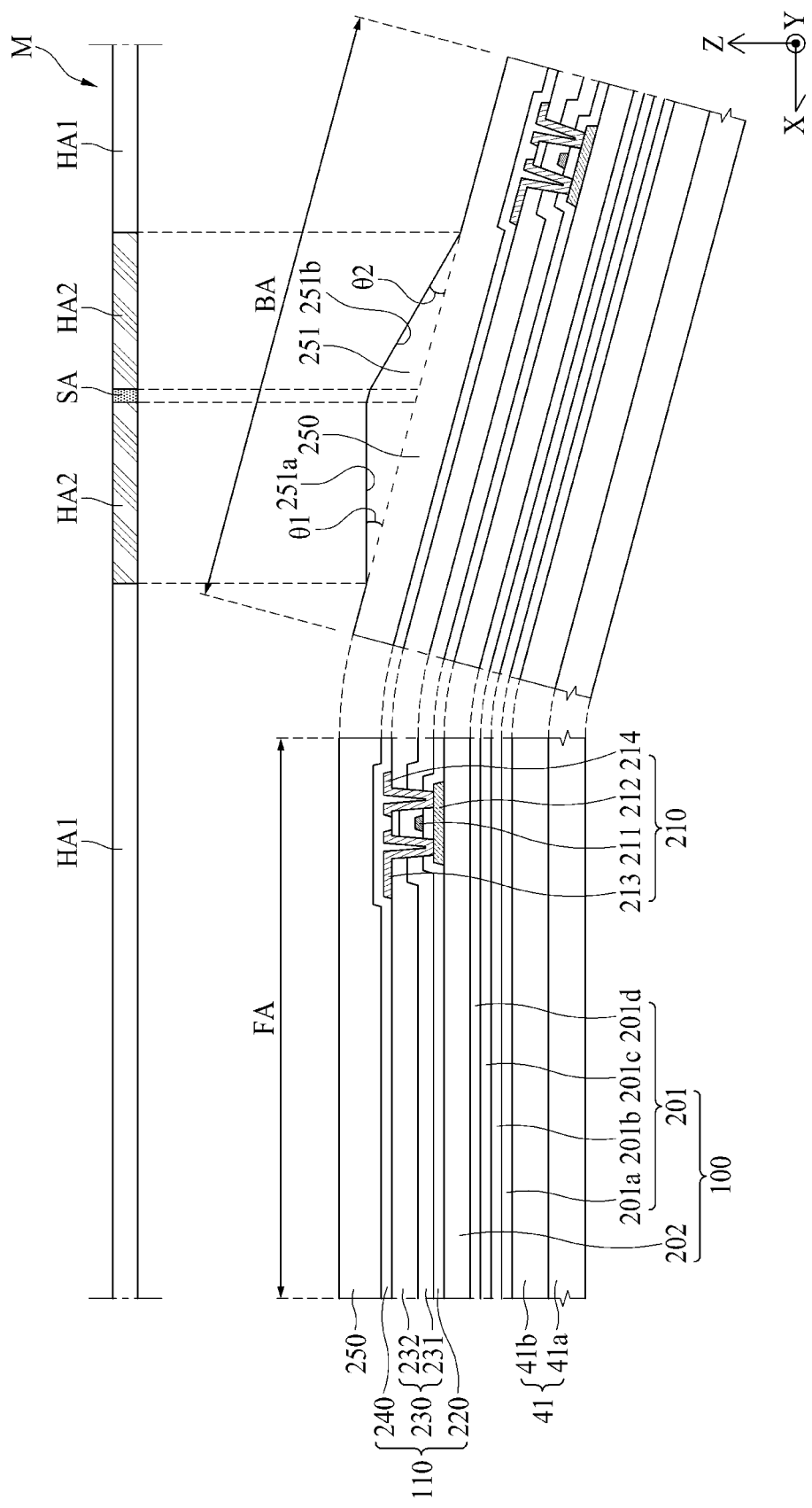

Second, as in FIGS. 14B and 14C, a planarization film 250 and a slope film 251 may be simultaneously formed. (S202 of FIG. 13)

In FIGS. 14B and 14C, an example where an organic film 250' for forming the planarization film 250 has a positive resist characteristic where a portion exposed to light is dissolved by a developing solution is mainly described.

In detail, as in FIG. 14B, in the flat part FA and the bending part BA, the organic film 250' may be formed on a protection film 240, and a mask M may be disposed on the organic film 250'. The organic film 250' may be formed of acryl resin, epoxy resin, phenolic resin, polyamide resin, polyimide resin, or the like, and for example, may be formed of photo acryl capable of a photo process.

The mask M may include a first halftone part HA1, a second halftone part HA2, and a light blocking part SA. The first halftone part HA1, as in FIG. 14B, may be disposed in a whole region of the flat part FA and a region, where the slope film 251 is not to be formed, of the bending part BA. Also, as in FIG. 14B, the second halftone part HA2 may be disposed in regions corresponding to zones where the first surface 251a and the second surface 251b of the slope film 251 are to be formed, and the light blocking part SA may be disposed in a boundary between the regions corresponding to the zones where the first surface 251a and the second surface 251b of the slope film 251 are to be formed. A light transmittance of the first halftone part HA1 may be higher than that of the second halftone part HA2.

The mask M may be disposed on the organic film 250', and then, by performing an exposure process and a development process, the slope film 251 may be formed as in FIG. 14C. Since only a portion of an upper portion of the organic film 250' disposed in the first halftone part HA1 is exposed to light, only the portion, exposed to the light, of the upper portion of the organic film 250' may be removed through the development process. Since the organic film 250' disposed in the light blocking part SA is not exposed to light, the organic film 250' may not be removed through the development process. Since only a portion of an upper portion of the organic film 250' disposed in the second halftone part HA2 is exposed to light, only the portion, exposed to the light, of the upper portion of the organic film 250' may be removed through the development process. Since a light transmittance of the second halftone part HA2 is lower than that of the first halftone part HA1, the upper portion of the organic film 250' disposed in the second halftone part HA2 may be removed less than an upper portion of the organic film 250' disposed in the first halftone part HA1.

The second halftone part HA2 may be disposed between the first halftone part HA1 and the light blocking part SA, and thus, the organic film 250' may be formed to have a height which increases in a direction from the first halftone part HA1 to the light blocking part SA. Therefore, as in FIG. 14C, the first surface 251a of the slope film 251 may be provided to form a first angle "θ1" with respect to an upper surface of the planarization film 250, and the second surface 251b of the slope film 251 may be provided to form a second angle "θ2" with respect to the upper surface of the planarization film 250.

When the organic film 250' has a negative characteristic where a portion unexposed to light is dissolved by a developing solution, the light blocking part SA may be disposed in a whole region of the flat part FA and a region, where the slope film 251 is not to be formed, of the bending part BA. Also, the second halftone part HA2 may be disposed on the first surface 251a and the second surface 251b of the slope film 251, and the first halftone part HA1 may be disposed in a boundary between the first surface 251a and the second surface 251b of the slope film 251.

The first angle "θ1" between the first surface 251a of the slope film 251 and the upper surface of the planarization film 250 and the second angle "θ2" between the second surface 251b of the slope film 251 and the upper surface of the planarization film 250 may be adjusted based on a distance between the respective first halftone part HA1 and the light blocking part SA. For example, if the distance between the respective first halftone part HA1 and the light blocking part SA increases, the first angle "θ1" and the second angle "θ2" may decrease. Also, if the distance between the respective first halftone part HA1 and the light blocking part SA decreases, the first angle "θ1" and the second angle "θ2" may increase.

Figure 14D:
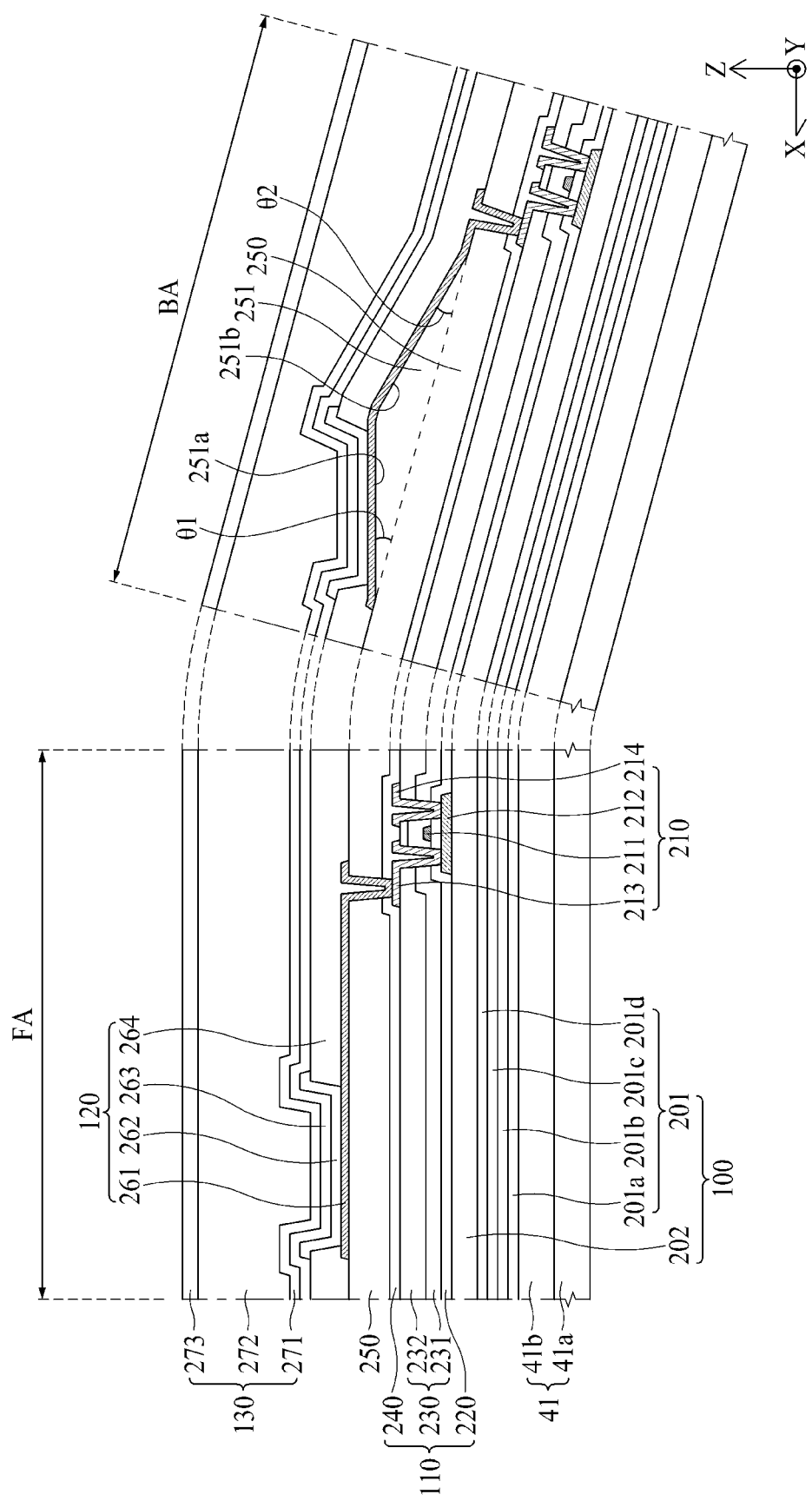

Third, as in FIG. 14D, a light emitting device layer 120 including a first electrode 261, an organic light emitting layer 262, and a second electrode 263 may be formed on the planarization film 250 of the flat part FA and the planarization film 250 and the slope film 251 of the bending part BA, and an encapsulation film 130 may be formed on the light emitting device layer 120. (S203 of FIG. 13)

Step S203 is substantially the same as step S103 described above with reference to FIS. 11 and 12D, and thus, a detailed description of step S203 is omitted.

As described above, according to the embodiments of the present disclosure, the slope film which is inclined by a first angle from the planarization film may be formed in the bending part by using the halftone mask. Therefore, according to the embodiments of the present disclosure, since the first surface of the slope film of the bending part is almost parallel to the upper surface of the planarization film of the flat part, an emission surface (or a display surface) of an emission area in the flat part may be provided in almost parallel with an emission surface (or a display surface) of an emission area in the bending part. Accordingly, according to the embodiments of the present disclosure, an emission direction of an image displayed by the display module in the flat part may be equal to or almost similar to an emission direction of an image displayed by the display module in the bending part. As a result, according to the embodiments of the present disclosure, a luminance difference and a color shift between the flat part and the bending part of the flexible display apparatus are prevented from being recognized by a user.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A curved display apparatus having a flat part and a bending part extending from one side of the flat part, either of the flat part and the bending part defining a plurality of emission areas therein, wherein the curved display apparatus comprises:
a light emitting device layer including a plurality of light emitting devices to form the emission areas,
wherein a slope film is provided in the bending part such that an emission surface of the emission areas in the bending part is almost parallel to an emission surface of the emission areas in the flat part, and the slope film is disposed on a planarization film disposed in the flat part and the bending part,
a first electrode of the flat part is disposed on and is in contact with the planarization film, and a first electrode of the bending part is disposed on and is in contact with the slope film,
wherein the slope film comprises:
a first surface forming a first angle with respect to an upper surface of the planarization film; and
a second surface forming a second angle with respect to the upper surface of the planarization film,
wherein the first electrode of the bending part is disposed on the first surface and the second surface
a bank is provided on the second surface, and
a light emitting layer is provided only on the first electrode disposed on the first surface.

2. The curved display apparatus as recited in claim 1, wherein each light emitting device comprises the first electrode, a second electrode and the light emitting layer provided between and electrically connected to the first and second electrodes, the first electrode of each of the plurality of light emitting devices is disposed independently, and
wherein the first surface is almost parallel to the emission surface of the emission area in the flat part.

3. The curved display apparatus as recited in claim 2, wherein the first surface forms the first angle with respect to the planarization film in the bending part, and the first angle increases as a distance to the flat part increasing.

4. The curved display apparatus as recited in any one of claims 1, further comprising a TFT layer including a plurality of TFTs, wherein the first electrode of each light emitting device is electrically connected to a source electrode or a drain electrode of a corresponding TFT.

5. The curved display apparatus as recited in claim 4, wherein a protection film for insulating the TFTs is provided on the source electrode and the drain electrode of the TFTs.

6. The curved display apparatus as recited in claim 5, wherein the planarization film for planarizing a step height caused by the TFTs is formed on the protection film.

7. The curved display apparatus as recited in claim 6, wherein the slope film is provided on the planarization film in the bending part, the first surface of the slope film is almost parallel to an upper surface of the planarization film in the flat part.

8. The curved display apparatus as recited in claim 7, wherein the bank is provided on the planarization film and the slope film to define a plurality of cavities for forming the emission areas, each of which cavities is an area where the first electrode, the light emitting layer and the second electrode of a corresponding light emitting device are sequentially stacked.

9. The curved display apparatus as recited in claim 7, wherein the slope film has a triangular cross-section.

10. The curved display apparatus as recited in claim 7, wherein the slope film comprises the same material as that of the planarization film.

11. The curved display apparatus as recited in claim 9, wherein the triangular cross-section has a first side defined by the first surface and a second side not contacting a surface of the planarization film in the bending part, and the first side is longer than the second side.

12. The curved display apparatus as recited in claim 1, wherein the bank is provided on the first electrode disposed on the second surface.

13. The curved display apparatus as recited in claim 1, wherein the bank provided on the second surface extends to cover the planarization film disposed in the bending part.

14. A curved display apparatus including a flat part and a bending part extending from one side of the flat part, the curved display apparatus comprising:
- a thin film transistor (TFT) layer disposed on a substrate;
- a planarization film disposed on the TFT layer;
- a slope film disposed on the planarization film and inclined by a first angle from the planarization film;
- a plurality of first electrodes disposed on the planarization film and the slope film;
- a plurality of light emitting layers respectively disposed on the plurality of first electrodes; and
- a second electrode disposed on the plurality of light emitting layers,
- wherein a first electrode of the flat part among the plurality of first electrodes is disposed on and is in contact with the planarization film, and a first electrode of the bending part among the plurality of first electrodes is disposed on and is in contact with the slope film,
- wherein the slope film comprises:
  - a first surface forming a first angle with respect to an upper surface of the planarization film; and
  - a second surface forming a second angle with respect to the upper surface of the planarization film,
- wherein the first electrode of the bending part is disposed on the first surface and the second surface,
- a bank is provided on the second surface, and
- a light emitting layer is provided only on the first electrode disposed on the first surface.

15. The curved display apparatus of claim 14, wherein the bank is provided on the first electrode disposed on the second surface.

16. The curved display apparatus of claim 14, wherein the second angle is equal to the first angle, or is greater than the first angle and is 90 degrees or less.

17. The curved display apparatus of claim 14, wherein the bank provided on the second surface extends to cover the planarization film disposed in the bending part.

* * * * *